(12) United States Patent
Walker et al.

(10) Patent No.: US 8,841,727 B1
(45) Date of Patent: Sep. 23, 2014

(54) CIRCUIT WITH ELECTROSTATIC DISCHARGE PROTECTION

(75) Inventors: Andrew Walker, Mountain View, CA (US); Helmut Puchner, Santa Clara, CA (US); Sai Dhanraj, Milpitas, CA (US); Kevin Jang, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/620,161

(22) Filed: Sep. 14, 2012

Related U.S. Application Data

(63) Continuation of application No. 12/636,596, filed on Dec. 11, 2009, now Pat. No. 8,283,727, which is a continuation-in-part of application No. 12/435,320, filed on May 4, 2009, now Pat. No. 8,143,673.

(60) Provisional application No. 61/122,075, filed on Dec. 12, 2008, provisional application No. 61/049,772, filed on May 2, 2008, provisional application No. 61/049,773, filed on May 2, 2008.

(51) Int. Cl.
*H01L 23/62* (2006.01)
(52) U.S. Cl.
USPC .................................. 257/355; 257/E29.012
(58) Field of Classification Search
CPC . H01L 29/1016; H01L 29/87; H01L 29/7436; H01L 27/0262; H01L 27/0266
USPC .......................................... 257/355, E29.012
See application file for complete search history.

(56) References Cited

U.S. PATENT DOCUMENTS

| | | | |
|---|---|---|---|
| 5,182,220 A | 1/1993 | Ker et al. | |
| 5,517,051 A * | 5/1996 | Chatterjee | 257/360 |
| 5,719,733 A | 2/1998 | Wei et al. | |
| 5,754,380 A | 5/1998 | Ker et al. | |
| 5,825,600 A | 10/1998 | Watt | |
| 5,903,032 A | 5/1999 | Duvvury | |
| 6,066,879 A | 5/2000 | Lee et al. | |
| 6,144,070 A * | 11/2000 | Devore et al. | 257/343 |
| 6,169,309 B1 | 1/2001 | Teggatz et al. | |
| 6,365,940 B1 | 4/2002 | Duvvury et al. | |
| 6,433,368 B1 | 8/2002 | Vashchenko et al. | |
| 6,459,127 B1 | 10/2002 | Lee et al. | |
| 6,548,874 B1 | 4/2003 | Efland et al. | |
| 6,576,934 B2 | 6/2003 | Cheng et al. | |
| 6,576,959 B2 * | 6/2003 | Kunz et al. | 257/355 |
| 6,614,077 B2 | 9/2003 | Nakamura et al. | |
| 6,696,708 B2 | 2/2004 | Hou et al. | |
| 6,900,091 B2 | 5/2005 | Williams et al. | |
| 6,924,531 B2 | 8/2005 | Chen et al. | |
| 7,202,114 B2 | 4/2007 | Salcedo et al. | |

(Continued)

OTHER PUBLICATIONS

U.S. Appl. No. 12/435,320 "Circuit With Electrostatic Discharge Protection" filed May 4, 2009;49 pages.

(Continued)

*Primary Examiner* — Trung Q Dang

(57) ABSTRACT

A circuit with electrostatic discharge protection is described. In one case, the circuit includes trigger device configured to protect a component connected to a node of the circuit during an electrostatic discharge event, the trigger device includes an isolation structure interposed between a gate oxide layer and an extended drain region. A portion of the extended drain region proximate the isolation structure is substantially metal-free.

8 Claims, 12 Drawing Sheets

(56) References Cited

U.S. PATENT DOCUMENTS

| | | | |
|---|---|---|---|
| 7,205,630 | B2 | 4/2007 | Chang et al. |
| 7,271,629 | B2 | 9/2007 | Jeon et al. |
| 7,659,558 | B1 | 2/2010 | Walker et al. |
| 7,667,241 | B1 | 2/2010 | Walker et al. |
| 7,838,937 | B1 * | 11/2010 | Walker et al. ............... 257/355 |
| 7,910,951 | B2 | 3/2011 | Vashchenko |
| 8,129,788 | B1 | 3/2012 | Walker et al. |
| 8,143,673 | B1 | 3/2012 | Walker et al. |
| 2002/0081783 | A1 * | 6/2002 | Lee et al. ............... 438/133 |
| 2004/0004231 | A1 | 1/2004 | Peng et al. |
| 2005/0254189 | A1 | 11/2005 | Wu et al. |
| 2006/0274465 | A1 | 12/2006 | Wu et al. |
| 2010/0109076 | A1 * | 5/2010 | Wang et al. ............... 257/328 |

OTHER PUBLICATIONS

Duvvury et al., "Device Integration for ESD Robustness of High Voltage Power MOSFETs," IEDM 1994, pp. 16.4.1-16.4.4.

Lee et al., "Novel ESD Protection Structure with Embedded SCR LDMOS for Smart Power Technology," 40th Annual International Reliability Physics Symposium, 2002, pp. 156-161; 6 pages.

USPTO Non-Final Rejection for U.S. Appl. No. 12/435,320 dated Mar. 30, 2011; 11 pages.

USPTO Non-Final Rejection for U.S. Appl. No. 13/620,161 dated Dec. 18, 2013; 7 pages.

USPTO Notice of Allowance for U.S. Appl. No. 12/435,320 dated Feb. 1, 2012; 7 pages.

USPTO Notice of Allowance for U.S. Appl. No. 12/435,320 dated Oct. 6, 2011; 7 pages.

USPTO Notice of Allowance for U.S. Appl. No. 12/636,596 dated Mar. 30, 2012; 8 pages.

USPTO Notice of Allowance for U.S. Appl. No. 12/636,596 dated May 18, 2012; 7 pages.

USPTO Notice of Allowance for U.S. Appl. No. 12/636,596 dated Jun. 22, 2012; 7 pages.

USPTO Notice of Allowance for U.S. Appl. No. 12/636,596 dated Aug. 6, 2012; 7 pages.

* cited by examiner

CIRCUIT WITH ELECTROSTATIC DISCHARGE PROTECTION

CROSS REFERENCE TO RELATED APPLICATIONS

This application is a continuation of U.S. Patent application Ser. No. 12/636,596 filed Dec. 11, 2009, now U.S. Pat. No. 8,283,727, issued Oct. 9, 2012, which claims priority to U.S. Provisional Patent Application No. 61/122,075, filed Dec. 12, 2008, and which is a continuation-in-part of U.S. Patent Application No. 12/435,320, filed May 4, 2009, now U.S. Pat. No. 8,143,673, issued Mar. 27, 2012, which claims priority to U.S. Provisional Patent Application No. 61/049,772, filed May 2, 2008, and to U.S. Provisional Patent Application No. 61/049,773, filed May 2, 2008, all of which are incorporated by reference herein in their entirety.

TECHNICAL FIELD

Embodiments of the present invention are in the field of electronic circuits and, in particular, circuits with electrostatic discharge protection.

BACKGROUND

As is well known in the microelectronics industry, integrated circuit devices may be susceptible to damage from application of excessive voltages, such as, for example, electrostatic discharge (ESD) events. In particular, during an ESD event, charge transferred within a circuit may develop voltages that are large enough to break down insulating films (e.g., gate oxides) on the device or dissipate sufficient energy to cause electrothermal failures in the device. Such failures may include contact spiking, silicon melting, or metal interconnect melting. As such, protection circuits are often connected to I/O bonding pads of an integrated circuit to safely dissipate energy associated with ESD events away from active circuitry. Protection circuits may also be connected to power supply pads or between power supply buses to prevent damage to active circuitry. In developing effective ESD protection circuitry, circuit designers may, however, be limited with regard to the particular structures used, since the protection circuit will often be closely associated with the remainder of the integrated circuit. For instance, integrated circuits which operate with applications of high voltages (e.g., $V_{DD}$>12 volts) may include protection circuitry configured to accommodate high voltage levels.

DETAILED DESCRIPTION

Overview

Figure 1:
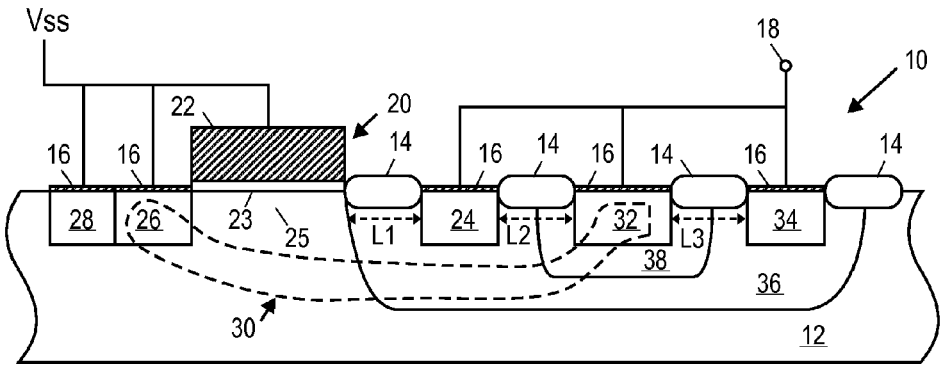
FIG. 1 illustrates a cross-sectional view of a semiconductor structure configured to provide protection from electrostatic discharge, in accordance with an embodiment of the present invention.

A circuit with electrostatic discharge protection is described herein. In the following description, numerous specific details are set forth, such as structural arrangements, in order to provide a thorough understanding of embodiments of the present invention. It will be apparent to one skilled in the art that embodiments of the present invention may be practiced without these specific details. In other instances, well-known fabrication operations, such as deposition and patterning operations, are not described in detail in order to not unnecessarily obscure embodiments of the present invention. Furthermore, it is to be understood that the various embodiments shown in the Figures are illustrative representations and are not necessarily drawn to scale.

Disclosed herein is a circuit with electrostatic discharge protection. In one embodiment, a circuit includes an output driver transistor with an extended drain contact region. The circuit also includes a distinct device configured to provide electrostatic discharge protection for the output driver transistor. The distinct device includes an electrostatic discharge protection transistor with an extended drain region. A top surface of the extended drain region can be insulated to reduce and/or eliminate current flow therethrough. In some cases, the entire top surface of the extended drain region is insulated. The distinct device also includes a silicon controlled rectifier including a first terminal spaced apart from the extended drain region of the electrostatic discharge protection transistor, and a second terminal configured to serve as a source contact region of the electrostatic discharge protection transistor. The distinct device also includes an ohmic contact region spaced apart from the first terminal of the silicon controlled rectifier, and a collection region arranged adjacent to the second terminal of the silicon controlled rectifier. In one embodiment, a circuit includes an output driver transistor with an extended drain contact region. The circuit also includes a distinct device configured to provide electrostatic discharge protection for the output driver transistor. The distinct device includes an electrostatic discharge protection transistor with an extended drain region, and a gate electrode spaced apart from the extended drain region by a field oxide isolation structure. A portion of the gate electrode overlaps at least a portion of the field oxide isolation structure. The distinct device also includes a silicon controlled rectifier including a first terminal spaced apart from the extended drain region of the electrostatic discharge protection transistor, and a second terminal configured to serve as a source contact region of the electrostatic discharge protection transistor. The distinct device also includes an ohmic contact region spaced apart from the first terminal of the silicon controlled rectifier, and a collection region arranged adjacent to the second terminal of the silicon controlled rectifier.

Also disclosed herein is a method for providing a trigger voltage for a circuit with electrostatic discharge protection. In one embodiment, a method includes forming an output driver transistor with an extended drain contact region. The method also includes forming a distinct device configured to provide electrostatic discharge protection for the output driver transistor. Forming the distinct device includes forming an electrostatic discharge protection transistor with an extended drain region and a gate electrode spaced apart from the extended drain region by a field oxide isolation structure. A portion of the length of the gate electrode overlaps at least a portion of the field oxide isolation structure, and the length of the portion of the gate electrode is selected to determine the trigger voltage. Forming the distinct device also includes forming a silicon controlled rectifier including forming a first terminal spaced apart from the extended drain region of the electrostatic discharge protection transistor, and forming a second terminal configured to serve as a source contact region of the electrostatic discharge protection transistor. Forming the distinct device also includes forming an ohmic contact region spaced apart from the first terminal of the silicon controlled rectifier, and forming a collection region arranged adjacent to the second terminal of the silicon controlled rectifier.

In accordance with an embodiment of the present invention, a drain extended metal oxide semiconductor (DEMOS) transistor structure is used for high voltage applications. A DEMOS transistor may also be referred to in the microelectronics industry as a laterally diffused metal oxide semiconductor (LDMOS) transistor. DEMOS transistors may differ from other metal oxide semiconductor (MOS) transistors in that the drain contact region may be laterally displaced apart from the channel of the transistor at a greater distance than the source contact region of the transistor. In an embodiment, as a consequence, the voltage across the channel of the DEMOS transistor is lower than a transistor having a drain contact region closer to the channel and, in turn, the electric field across a corresponding gate oxide is lower. Although DEMOS transistors may be effective for operations at high voltage levels, DEMOS transistors may be inherently susceptible to damage from ESD events due to their overall device structure. In one embodiment, effective ESD protection, however, actually uses low power dissipation capability under avalanche conditions. In an embodiment, the term "avalanche condition" may be defined as an event where the voltage experienced in a semiconductor region surpasses the breakdown voltage of the semiconductor region.

One approach in providing ESD protection for integrated circuits having DEMOS transistors may be to employ a silicon controlled rectifier (SCR) type structure for transferring charge away from the transistor. For example, some designs may incorporate SCRs within active DEMOS transistors of an integrated circuit (e.g., transistors used for operations of a device other than protection from ESD events). In an embodiment, such a configuration, however, relies on drain breakdown of the active DEMOS transistor to trigger the SCR. In some cases, triggering the SCR in such a manner may not be fast enough to prevent the active DEMOS transistor from being damaged and, therefore, may not be effective for many applications. In other embodiments, an SCR is incorporated within protection circuitry coupled to I/O bonding pads of an integrated circuit. In some cases, a protection-designated DEMOS transistor may further be included in the protection circuitry to trigger the SCR. In general, however, such configurations may have limited controllability of the trigger and holding voltages of the SCR. As a consequence, the level of ESD protection offered by such designs may be limited.

Accordingly, in an embodiment of the present invention, an ESD protection circuit may be developed to be suitable for use with an integrated circuit utilizing high voltage drain extended MOS transistors. In particular, an ESD protection device may be developed that allows the trigger voltage of an incorporated SCR to be set without affecting the operation of the laterally diffused output driver transistor which it is configured to protect. In addition, such a protection device may be arranged in a variety of manners within an integrated circuit such that energy associated with ESD events may be safely dissipated from different types of active circuit devices, including, but not limited to, pull-down output transistors or pull-up output transistors.

In a first aspect of embodiments of the present invention, turning to the drawings, exemplary devices for protecting LDMOS output driver transistors from damage caused by ESD events are illustrated in FIGS. 1-4. More specifically, in an embodiment, cross-sectional views of semiconductor topographies configured to divert charge from a bus coupled to an active LDMOS output driver transistor (e.g., an LDMOS pull-down output driver transistor or an LDMOS pull-up output driver transistor), are shown in FIGS. 1-4. In addition, FIG. 5 illustrates a schematic of a circuit detailing an arrangement of one or more of the semiconductor topographies depicted in FIGS. 1-4 in positions relative to output driver transistors, signal pads, and power supply pads of the circuit, in accordance with an embodiment of the present invention. As discussed in reference to FIG. 5, in an embodiment, the ESD protection devices described herein are distinct from the active LDMOS output driver transistors they are used to protect and, as such, the protection devices do not rely on the operation of or, more specifically, the avalanche of the active LDMOS output driver transistors.

As noted above, in accordance with an embodiment of the present invention, an LDMOS transistor (e.g., regardless of whether the transistor is used as an active transistor or as protection circuitry) is a MOS transistor having a drain contact region that is laterally displaced apart from the channel of the transistor at a greater distance than the source contact region is relative to channel. Such a configuration may be implemented in a variety of manners, some examples of which are shown in and described below in reference to FIGS. 1-4. As also noted above, an LDMOS transistor may be alternatively referenced as a drain extended MOS (DEMOS) transistor and, as such, the terms DEMOS and LDMOS may be used interchangeably. However, for simplifying the distinction between the transistor used as an output driver and the transistor configured to provide ESD protection of the output driver in the circuits described herein, the following may generally reference output driver transistors as LDMOS transistors and ESD protection transistors as DEMOS transistors. In embodiments also envisioned within the scope of the present invention, such nomenclature, however, may be reversed in some cases and, therefore, the references of such transistors are not so limited.

Example Configurations

FIG. 1 illustrates a cross-sectional view of a semiconductor structure configured to provide protection from electrostatic discharge, in accordance with an embodiment of the present invention. Referring to FIG. 1, an ESD protection device 10 includes DEMOS transistor 20, silicon controlled rectifier (SCR) 30, ohmic contact region 34, and collection region 28. As will be described in more detail below, in an embodiment, such components are collectively configured and arranged to transfer charge from a bus coupled to node 18 to a bus coupled to low power supply Vss. The bus coupled to node 18 is coupled to an active LDMOS output driver transistor of an integrated circuit (e.g., an LDMOS output transistor distinct from DEMOS transistor 20 and is used for operation of an integrated circuit other than for ESD protection). As such, in one embodiment, diverting charge from the bus coupled to node 18 may prevent excessive charge from accessing the active LDMOS output driver transistor.

As shown in FIG. 1, DEMOS transistor 20 includes gate 22 and gate oxide 23 disposed above semiconductor layer 12. The materials and dimensional characteristics of gate 22, gate oxide 23, and semiconductor layer 12 may include any of those known in the semiconductor fabrication industry for DEMOS transistors. For instance, in one embodiment, semiconductor layer 12 is a relatively lightly doped substrate or epitaxial layer (e.g., doped with a relatively light net concentration of electrically active p-type impurities or n-type impurities) and, thus, has a relatively low degree of conductivity. For example, in a specific embodiment, a doping level of semiconductor layer 12 is generally less than or equal to approximately $1.0 \times 10^{19}$ atoms $cm^{-3}$, more particularly between approximately $1.0 \times 10^{13}$ atoms $cm^{-3}$ and approximately $1.0 \times 10^{17}$ atoms $cm^{-3}$, and in some embodiments between about $1.0 \times 10^{14}$ atoms $cm^{-3}$ and about $1.0 \times 10^{16}$ atoms $cm^{-3}$.

As is also shown in FIG. 1, in an embodiment, DEMOS transistor 20 further includes drain contact region 24 and source contact region 26 disposed within semiconductor layer 12 on opposing sides of gate 22. As used herein, the terms "drain contact region" and "source contact region" may generally refer to the diffusion regions within the semiconductor substrate at which contact is made to allow current flow to and from the transistor. In some embodiments, cladding layer 16 may be formed over such regions, as well as over other ohmic contact regions of ESD protection device 10, to enhance the electrical conductivity of connections thereto. In an alternative embodiment, contacting the drain and source regions in the depicted structures might be achieved by forming a local silicide through the open contact via after the contact etch process. In a particular embodiment, the cladding layer does not contact with the neighboring isolation structures, and a significant gap is formed there between. Due to the specific reference of contact being made to the regions, the terms "drain contact region" and "source contact region" do not generally include lighter doped shallow regions which are sometimes interposed between drain and source contact regions and respective sidewalls of the gate to reduce hot carrier effects of the gate dielectric. Rather, in an embodiment, such lighter doped shallow regions are generally protected from contact by overlying spacer structures aligned with the sidewalls of the gate. It is noted that any of the configurations of DEMOS transistors described herein (e.g., those transistors included in devices which are configured to provide active LDMOS output driver transistors protection from ESD events) may include sidewall spacers or lightly doped shallow regions extending from gate sidewalls and, consequently, the ESD protection devices described herein are not necessarily limited to the illustrations of FIGS. 1-4. For instance, ESD protection device 10 may, in some embodiments, include sidewall spacers or lightly doped shallow regions extending from the sidewalls of gate 22 with respect to either or both of drain and source contact regions 24 and 26.

In an embodiment, drain contact region 24 and source contact region 26 each include a net concentration of electrically active dopants opposite of semiconductor layer 12. In other embodiments, drain contact region 24 and source contact region 26 are of the same conductivity type as semiconductor layer 12, but are disposed within well regions of opposite conductivity type. In such cases, drain contact region 24 and source contact region 26 may be isolated from semiconductor layer 12 as a consequence. In either case, the conductivity type of drain and source contact regions 24 and 26 may define the conductivity type of the DEMOS transistor fabricated therefrom. In particular, in one embodiment, n-type drain and source contact regions form an n-type DEMOS (DENMOS) transistor and p-type drain and source contact regions form a p-type DEMOS (DEPMOS) transistor.

In an embodiment, DEMOS transistor 20 is of the same conductivity type as the LDMOS output driver transistor it is configured to protect from ESD events. As such, the conductivity type of drain and source contact regions 24 and 26 may be dependent on the conductivity type of the protected LDMOS output driver transistor of the circuit. As noted above, the ESD protection devices described herein may be configured to protect either LDMOS pull-down output driver transistors or LDMOS pull-up output driver transistors. In general, pull-up and pull-down output driver transistors are of opposite conductivity types. In a particular embodiment, LDMOS pull-up output driver transistors are configured as p-type and LDMOS pull-down output driver transistors are configured as n-type, or in another particular embodiment, vice versa. As such, the conductivity type of DEMOS transistor 20 may, in some embodiments, depend on the type of the LDMOS output driver transistor being protected.

In either embodiment, drain contact region 24 may be laterally displaced away from channel region 25 at a farther distance than source contact region 26 such that a DEMOS transistor is formed. In an embodiment, a channel region generally refers to the region under gate 22 which is of opposite conductivity type from source and drain contact regions 26 and 24 prior to the application of a threshold voltage to gate 22 and is of the same conductivity type as source and drain contact regions 26 and 24 upon application of threshold voltage to gate 22 which allows the conduction of current through the transistor. In some embodiments, drain contact region 24 is spaced apart from gate 22 by field oxide isolation structure 14 to displace drain contact region 24 farther away from channel region 25 than source contact region 26, as depicted in FIG. 1. In other embodiments, field oxide isolation structure 14 is omitted from ESD protection circuit 10 and an alternative technique for displacing drain contact region 24 from channel region 25 is used. Other displacement techniques which may be employed include the use of sidewall spacers or isolation structures along gate 22, as described in the alternative embodiments of FIGS. 2 and 3. In yet other embodiments, a temporary masking layer is placed adjacent to gate 22 and dopants are implanted into the semiconductor topography such that drain contact region 24 is formed in a designated position relative to gate 22.

In an embodiment, drain contact region 24 is disposed within a lightly-doped well region of the same conductivity type as the drain contact region, such as depicted by well region 36 in FIG. 1. In one embodiment, the increased drain-to-substrate junction area provided by well region 36, along with the reduced dopant concentration at the drain-to-substrate junction, greatly increases the junction breakdown voltage to permit higher voltage operation of the transistor. In a particular embodiment, well region 36 is fabricated to extend along the sidewalls of gate 22 or beneath a portion of gate 22 to an isolation region disposed on the outlying side of drain contact region 24 such that drain contact region 24 is enveloped therein. In other embodiments, well region 36 is extended to additionally envelop one or both of ohmic contact regions 32 and 34, as is depicted in FIG. 1. In either case, in an embodiment, well region 36 has a doping level less than drain contact region 24, such as between approximately $1.0 \times 10^{16}$ atoms cm$^{-3}$ and approximately $5.0 \times 10^{18}$ atoms cm$^{-3}$, more specifically between approximately $5.0 \times 10^{16}$ atoms cm$^{-3}$ and approximately $1.0 \times 10^{18}$ atoms cm$^{-3}$, and in some embodiments around $2.0 \times 10^{17}$ atoms cm$^{-3}$. By contrast, in an embodiment, drain contact region 24, as well as source contact region 26, has a doping level between approximately $1.0 \times 10^{19}$ atoms cm$^{-3}$ and approximately $1.0 \times 10^{21}$ atoms cm$^{-3}$, more specifically between approximately $1.0 \times 10^{20}$ atoms cm$^{-3}$ and approximately $1.0 \times 10^{21}$ atoms cm$^{-3}$, and in some embodiments around $1.0 \times 10^{20}$ atoms cm$^{-3}$.

In an embodiment, the breakdown voltage of drain contact region 24 corresponds to the distance the drain contact region is displaced from the channel region beneath gate 22, denoted as L1 in FIG. 1. Consequently, with the incorporation of well region 36 and, in some cases, field oxide isolation structure 14, the breakdown voltage of drain contact region 24 may be set and, in some embodiments, optimized for the operation ESD device 10. In other cases, well region 36 may be omitted from DEMOS transistor 20. Exemplary configurations of DEMOS transistors without a well region enveloped around drain contact region 24 are shown and described in reference to FIGS. 3 and 4 below. In any case, it may be useful in some embodiments to configure the breakdown of DEMOS transistor 20 at a lower voltage than a breakdown voltage of the active LDMOS output driver transistor ESD protection device 10 is configured to protect. In this manner, in an embodiment, ESD protection device 10 is configured to divert the excessive voltage on a bus coupled to the active LDMOS output driver transistor prior to the LDMOS transistor breaking down. As a result, damage to the active LDMOS output driver transistor due to ESD events may be prevented.

As noted above, DEMOS transistors may generally be used for operations employing high voltages. In reference to such transistors, the term "high voltage" may generally refer to voltages exceeding approximately 5 volts. As such, in accordance with an embodiment of the present invention, DEMOS transistor 20 may generally be configured to breakdown at a voltage exceeding approximately 5 volts and less than the breakdown voltage of the active DEMOS transistor being protected. In general, the ESD protection devices described herein may be configured to protect LDMOS output driver transistors of either conductivity type. In addition, as noted above, the ESD protection devices described herein may be configured to protect either LDMOS pull-down output driver transistors or LDMOS pull-up output driver transistors. In an embodiment, since LDMOS pull-up and pull-down output driver transistors are fabricated of opposite conductivity types and the breakdown voltage of a transistor is generally dependent upon its conductivity type, the voltage at which DEMOS transistor 20 is configured to breakdown at is dependent on the type of output driver transistor DEMOS transistor 20 is employed to protect.

Many active n-type LDMOS (LDNMOS) output driver transistors used in current electronics applications may employ an operating range between approximately 36 volts and approximately 40 volts and a breakdown voltage between approximately 60 volts and approximately 65 volts. As such, DEMOS transistor 20 may, in some embodiments, be specifically configured to breakdown between approximately 40 volts and approximately 56 volts and, more specifically, between approximately 44 volts and approximately 56 volts to accommodate such a configuration of active LDNMOS output driver transistors. LDNMOS transistors may be used for pull-down output driver transistors and, therefore, such ranges may be particularly applicable in embodiments in which ESD protection device 10 is used to protect an LDNMOS pull-down output driver transistor from ESD events. In other embodiments, however, such ranges may be employed for embodiments in which ESD protection device 10 is used to protect an LDNMOS pull-up output driver transistor from ESD events.

In contrast, many active p-type LDMOS (LDPMOS) output driver transistors used in current electronic applications may employ an operating range between approximately 20 volts and approximately 22 volts and breakdown voltage between approximately 45 volts and approximately 50 volts. As such, DEMOS transistor 20 may, in some embodiments, be specifically configured to breakdown between approximately 20 volts and approximately 40 volts and, more specifically, between approximately 30 volts and approximately 40 volts to accommodate such a configuration of active LDPMOS output driver transistors. LDPMOS transistors may be used for pull-up output driver transistors and, therefore, such ranges may be particularly applicable in embodiments in which ESD protection device 10 is used to protect an LDPMOS pull-up output driver transistor from ESD events. In other embodiments, however, such ranges may be employed for embodiments in which ESD protection device 10 is used to protect an LDPMOS pull-down output driver transistor from ESD events. The aforementioned breakdown voltage ranges for DEMOS transistor 20 are exemplary and, therefore, are not intended to limit the ESD protection devices described in embodiments herein. In particular, DEMOS transistor 20 may be configured to breakdown at higher or lower breakdown voltages than the aforementioned values, depending on the design specifications of the active DEMOS output driver transistor being protected.

In an embodiment, a selected distance range for L1 to accommodate the breakdown voltages of DEMOS transistor 20 is approximately in the range of 0.5 micron to 10 microns, depending on the dimensional specifications of gate 22 and gate oxide 23 as well as the doping specifications of drain and source contact regions 24 and 26, well region 36, and semiconductor layer 12. In some embodiments, distances approximately in the range of 1.0 micron to 3.0 microns, or more specifically, approximately 1.5 microns are be applicable for L1, particularly in embodiments in which DEMOS transistor is of n-type conductivity type. Longer or shorter distances for L1, however, may be employed, depending on the design specifications of the device.

Figure 2:
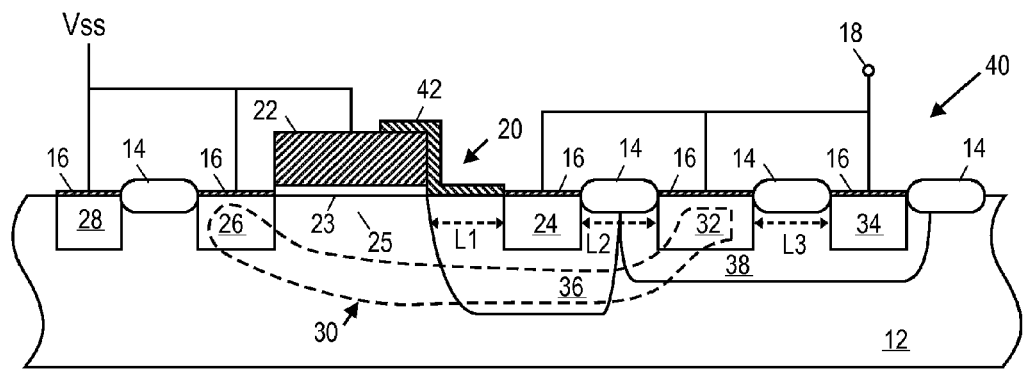
FIG. 2 illustrates a cross-sectional view of a semiconductor structure configured to provide protection from electrostatic discharge, in accordance with an embodiment of the present invention.

Spaced adjacent to drain contact region 24 by field oxide isolation structures 14, in an embodiment, ESD protection device 10 includes ohmic contact regions 32 and 34, as depicted in FIG. 1. As with drain contact region 24 and source contact region 26, one or both of ohmic contact regions 32 and 34 may include cladding layer 16 thereon to reduce resistance of the connections to the respective power supplies and busses. In an embodiment, ohmic contact region 34 is of the same conductivity type as drain and source contact regions 24 and 26, while ohmic contact region 32 is of the opposite conductivity type. In general, ohmic contact region 34 may include a concentration level with the range described above for source and drain contact regions 24 and 26. In addition, ohmic contact region 32 may include a concentration level with the range described below for collection region 28. As noted above, ohmic contact regions 32 and 34 may, in some embodiments, be disposed within well region 36, as depicted in FIG. 1. In other embodiments, well region 36 excludes one or both of ohmic contact regions 32 and 34. In such cases, one or both of ohmic contact regions 32 and 34 may be disposed within a separate well region. An embodiment of a configuration in which ohmic contact regions 32 and 34 are disposed within a different well region than drain contact region 24 is depicted in FIG. 2 and is described in more detail below.

Regardless of the configuration of well region 36, ESD protection device 10 may, in some embodiments, include well region 38 surrounding ohmic contact region 32. Well region 38 may be of the opposite conductivity type as ohmic contact region 32 and, thus, may be of the same conductivity type as well region 36. Well region 38, however, may differ from well region 36 by having a greater net concentration of impurities, making it slightly more conductive. For example, in one embodiment, well region 38 has a doping level between approximately $1.0 \times 10^{17}$ atoms cm$^{-3}$ and approximately $1.0 \times 10^{20}$ atoms cm$^{-3}$, more specifically between approximately $1.0 \times 10^{18}$ atoms cm$^{-3}$ and approximately $1.0 \times 10^{19}$ atoms cm$^{-3}$, and in some embodiments around $5.0 \times 10^{18}$ atoms cm$^{-3}$. In some embodiments, well region 38 envelops ohmic contact region 34 in addition or alternative to well region 36. In yet other embodiments, well region 38 is omitted from ESD protection device 10.

In accordance with an embodiment of the present invention, due to the arrangement of ohmic contact region 32 and well region 36, a pnpn junction is formed among ohmic contact region 32, well region 36, semiconductor layer 12, and source contact region 26. More specifically, a first bipolar transistor (either npn or pnp) is formed by source contact region 26 (emitter or collector), semiconductor layer 12 (base), and well region 36 (collector or emitter). In addition, a second bipolar transistor (either pnp or npn) is formed by ohmic contact region 32 (emitter or collector), well region 36 (base), and semiconductor layer 12 (collector or emitter). Collectively, in an embodiment, the bipolar transistors serve as silicon controlled rectifier (SCR) 30. In a particular embodiment, source contact region 26 and ohmic contact region 32 serve as cathodes and anodes of SCR 30, respectively or vice versa, depending on the conductivity types of the regions formed within ESD protection device 10. The dotted line region shown in FIG. 1 is used to illustrate the general connection of diffusion regions making up SCR 30 and is not intended to imply a particular boundary of the SCR.

The relative operation of SCR 30 to DEMOS transistor 20 and other components within ESD protection device 10 is described in more detail below, but in one embodiment includes the avalanche of drain contact region 24 triggering SCR 30 (e.g., forward bias ohmic contact region 32 to generate charge within semiconductor layer 12). As such, not only does the distance between drain contact region 24 and ohmic contact region 32, denoted in FIG. 1 as L2, determine the breakdown voltage of drain contact regions 24, in an embodiment, distance L2 also determines the triggering voltage of SCR 30, both of which may be set by the width of the isolation structure there between. As a result, the trigger voltage of SCR 30 may be set without affecting the operation of the laterally diffused output driver transistor which, in one embodiment, SCR 30 is configured to protect.

In an embodiment, the distance between drain contact region 24 and ohmic contact region 32, denoted in FIG. 1 as L2, and the distance between ohmic contact regions 32 and 34, denoted in FIG. 1 as L3, correspond to the holding voltage of SCR 30. Consequently, L2 and L3 may be set to partially affect the holding voltage of SCR 30 by the width of the isolation structures therebetween. As with L1, in an embodiment, distance ranges for L2 and L3 are approximately in the range of 0.5 micron to 10 microns, depending on the dimensional and doping specifications of ohmic contact regions 32 and 34 and semiconductor layer 12. In some embodiments, distances approximately in the range of 1.0 micron to 3.0 microns, or more specifically, around 1.5 microns are particularly applicable for L2 and L3. Longer or shorter distances for L2 and L3, however, may be employed, depending on the design specifications of the device. It is noted that although field oxide isolation structures 14 are shown in FIG. 1 as having substantially equal widths, embodiments of ESD protection device 10 are not so limited. In particular, each of the field oxide isolation structures 14 may be independently optimized for the operation of ESD protection device 10 and, therefore, one of more of the field oxide isolation structures 14 may differ in size in some embodiments.

The charge generated within semiconductor layer 12 from SCR 30 may be collected at collection region 28, which in turn is coupled to low power supply Vss to dissipate the charge. As with the other contact regions of ESD protection device 10, collection region 28 may, in some embodiments, include cladding layer 16 thereon to reduce resistance of the connections to Vss. In an embodiment, collection region 28 includes the same net conductivity type as ohmic contact region 32 and semiconductor layer 12. In order to generate charge from SCR 30 and pass it to collection region 28, ohmic contact region 32 and collection region 28 may generally be configured to have relatively high conductivity. For instance, in some embodiments, ohmic contact region 32 and collection region 28 include relatively similar or different dopant concentration levels between approximately $1.0 \times 10^{19}$ atoms cm$^{-3}$ and approximately $1.0 \times 10^{21}$ atoms cm$^{-3}$, more specifically between approximately $1.0 \times 10^{20}$ atoms cm$^{-3}$ and approximately $1.0 \times 10^{21}$ atoms cm$^{-3}$, and in some cases about $1.0 \times 10^{20}$ atoms cm$^{-3}$. Although collection region 28 is shown bordering source contact region 26 in FIG. 1, the placement of the region is not so limited. For example, in a particular embodiment, collection region 28 is alternatively spaced apart from source contact region 26 by a portion of semiconductor layer 12 and, in some cases, is spaced apart from source contact region 26 by a field oxide isolation structure, as shown and described in reference to FIG. 2 below.

As is also depicted in FIG. 1, source contact region 26, gate 22, and collection region 28 are coupled to low power supply Vss. In contrast, in an embodiment, drain contact region 24 and ohmic contact regions 32 and 34 are coupled to node 18, which in turn is coupled to a bus coupled to a high voltage signal pad or a high voltage power supply. When an integrated circuit including ESD protection device 10 is powered-up, in an embodiment node 18 is effectively at 0 volts and SCR 30 is initially in a first, high-impedance "OFF" state. In the first state, any voltage that is applied to input pads of the integrated circuit in excess of the high voltage power supply $V_{DD}$ but below the threshold trigger level of DEMOS transistor 20, will not cause large leakage currents to be drawn through ESD protection device 10. Rather, in an embodiment, such initial voltages will at most cause relatively small, transient currents to flow through active devices of the integrated circuit to charge the bus coupled to node 18 to a voltage level below the excessive voltage being applied. Subsequent applications of voltages higher than $V_{DD}$ will cause substantially no further input leakage currents to flow. In some embodiments, controlled application of voltages, even in excess of $V_{DD}$, to pins of the device in this context may be considered "normal." However, in an embodiment, ESD events are not considered part of the "normal" operation of the device.

In embodiments in which ESD protection device 10 is configured to protect an LDMOS pull-down output driver transistor of a circuit, a subsequent positive polarity ESD event on a high voltage signal pad with respect to Vss will result in the LDMOS pull-down output driver transistor becoming forward biased and shunting the charge from the corresponding source to a bus coupled to node 18. As charge is transferred onto the bus, voltage on the bus increases with respect to Vss. For voltages below the breakdown voltage of drain contact region 24, the voltage on drain contact region 24 is approximately equal to that on the bus. This approximation is fairly accurate since the current level being drawn from the bus is fairly low. When the voltage on the bus coupled to node 18 reaches the breakdown voltage of drain contact region 24, current begins to flow from drain contact region 24 into well region 36. The current flow causes a voltage drop across well region 36, which in turn forward biases ohmic contact region 32, resulting in an injection of charge (e.g., holes in embodiments in which ohmic contact region 34 is n-type and electrons when ohmic contact region 34 is p-type) into semiconductor layer 12. A similar operation of ESD protection device 10 may be employed for negative polarity ESD events on a high voltage signal pad with respect to $V_{DD}$ in embodiments in which ESD protection device 10 is configured to protect an LDMOS pull-up output driver transistor of a circuit (e.g., when ESD protection device 10 is employed as a core clamp between high and low voltage power supplies of the integrated circuit).

In either of the above embodiments, the injection of the charge from ohmic contact region 32 can hasten the transition of SCR 30 into a latched state. In some embodiments, such a low-impedance "ON" state of SCR 30 is characterized by a voltage drop of approximately 5 volts between the bus coupled to node 18 and negative power supply bus Vss, although other values of voltage drops may result. Inasmuch as the injection of charge from ohmic contact region 32 is initiated, in an embodiment, the time lag between the occurrence of an ESD event and when SCR 30 turns on becomes sufficiently short to effectively handle relatively fast ESD events, such as ESD events occurring according to the Charged Device Model (CDM), for example. In one embodiment, SCR 30 will remain in the low-impedance state until current through either the bipolar transistors of SCR 30 is interrupted. This interruption may occur when all of the charge from the ESD event is transferred from node 18 to Vss. In a particular embodiment, once the charge transfer is complete, SCR 30 returns to a high-impedance "OFF" state.

Figure 3:
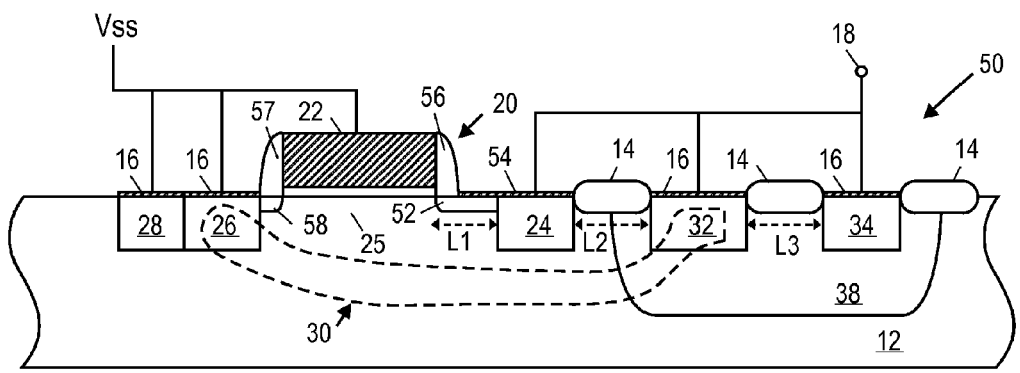
FIG. 3 illustrates a cross-sectional view of a semiconductor structure configured to provide protection from electrostatic discharge, in accordance with an embodiment of the present invention.
Figure 4:
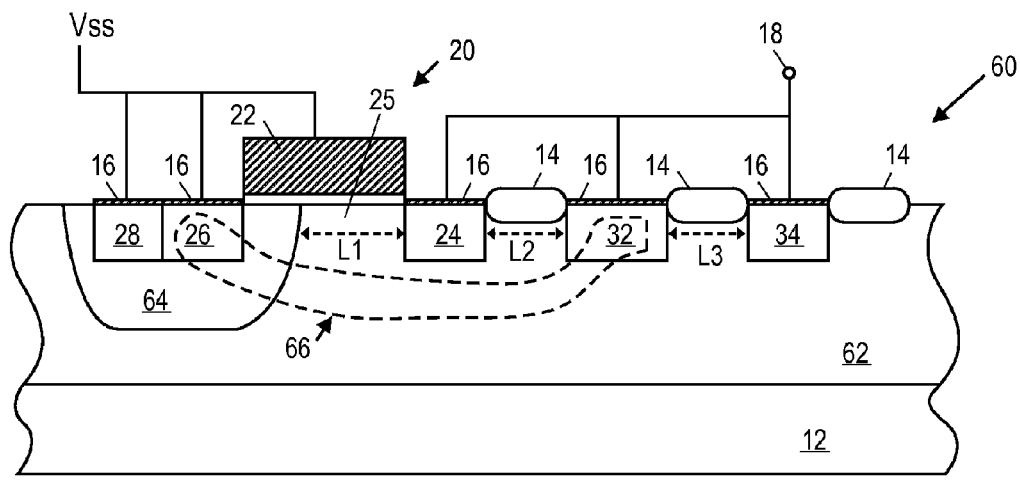
FIG. 4 illustrates a cross-sectional view of a semiconductor structure configured to provide protection from electrostatic discharge, in accordance with an embodiment of the present invention.
Figure 5:
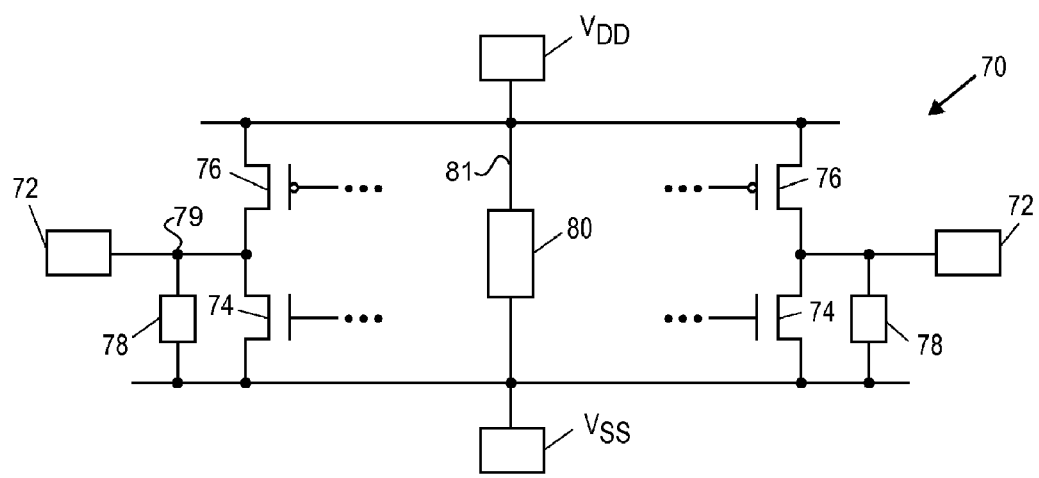
FIG. 5 illustrates a schematic of an exemplary circuit depicting an arrangement of one or more of the semiconductor structures depicted in FIGS. 1-4 in positions relative to output driver transistors, signal pads, and power supply pads of the circuit, in accordance with an embodiment of the present invention.

Alternative embodiments with configurations of ESD protection circuits that are adapted to divert charge from a bus coupled to an LDMOS output driver transistor are shown in FIGS. 2-4. In particular, FIGS. 2-4 illustrate alternative configurations of drain extended MOS transistors which may be configured with a plurality of diffusion regions to form an ESD protection device having an SCR configured to trigger upon avalanche of the corresponding DEMOS transistor. As shown in FIGS. 2-4, ESD protection circuits 40, 50, and 60 may include many of the same components as ESD protection circuit 10 in FIG. 1. In a particular embodiment, the components in FIGS. 2-4 having the same reference numbers as the components shown in FIG. 1 have substantially similar and, therefore, the description of such components for ESD protection device 10 are referenced for ESD protection devices 40, 50, and 60.

FIG. 2 illustrates a cross-sectional view of a semiconductor structure configured to provide protection from electrostatic discharge, in accordance with an embodiment of the present invention. Referring to FIG. 2, ESD protection circuit 40 differs from ESD protection circuit 10 in FIG. 1 by the use of isolation structure 42 along gate 22 and above a portion of well region 36 to extend drain contact region 24 apart from gate 22. Structure 42 includes a dielectric material, such as silicon dioxide or silicon nitride, and, in some embodiments, is used to prevent the formation of silicide structures along gate 22. In accordance with an embodiment of the present invention, ESD protection device 40 further differs from ESD protection device 10 in that collection region 28 is spaced apart from source contact region 26 by field oxide isolation structure 14. In addition, well region 36 does not include ohmic contact regions 32 and 34 in ESD protection device 40 and well region 38 is extended to include ohmic contact region 34. It is noted that the use of isolation structure 42, the alternative placement of collection region 28, the exclusion of ohmic contact regions 32 and 34 within well region 36, and the extension of well region 38 to include ohmic contact region 34 are not mutually exclusive to ESD protection circuit 40 and, therefore, any one or more of such alternative configurations may be incorporated into ESD protection circuit 10 or other embodiments of ESD protection devices described herein.

FIG. 3 illustrates a cross-sectional view of a semiconductor structure configured to provide protection from electrostatic discharge, in accordance with an embodiment of the present invention. Referring to FIG. 3, ESD protection circuit 50 differs from ESD protection circuit 10 in FIG. 1 by the exclusion of well region 36 and, instead includes lightly doped shallow region 52 and sidewall spacer 56. ESD protection circuit 50 further includes cladding layer 54 extending over drain contact region 24 and a portion of lightly doped shallow region 52 abut to sidewall spacer 56. Furthermore, in accordance with an embodiment of the present invention, ESD protection circuit 50 includes sidewall spacer 57 on the opposing side of gate 22 and also includes lightly doped shallow region 58 displacing source contact region 26 from gate 22. In some embodiments, lightly doped shallow regions 52 and 58 include substantially similar concentrations. In other embodiments, however, lightly doped shallow region 52 includes a smaller net concentration of impurities than lightly doped shallow region 58. In yet other embodiments, any combination of the components described in reference to FIGS. 1-3 may be used to extend a drain contact region from a gate to form a DEMOS transistor. For example, both an isolation region and a lightly doped shallow region may be used to extend drain contact region 24 from gate 22. In other embodiments, spacer 56 and extended cladding layer 54 are formed over drain contact region 24 while disposed within well 36.

FIG. 4 illustrates a cross-sectional view of a semiconductor structure configured to provide protection from electrostatic discharge, in accordance with an embodiment of the present invention. Referring to FIG. 4, ESD protection device 60 includes a different configuration of well regions and further illustrates the arrangement of such well regions as well as drain and source contact regions 24 and 26 and ohmic contact regions 32 and 34 within a semiconductor layer of an opposite conductivity type than described in reference to FIGS. 1-3. In accordance with a particular embodiment of the present invention, FIG. 4 depicts ESD protection device 60 as including semiconductor layer 62 arranged above semiconductor layer 12 and doped of the same conductivity type as drain and source contact regions 24 and 26, as well as ohmic contact region 34. In general, semiconductor layer 62 may include a doping concentration in the range described for well region 36. Well regions 36 and 38 have been omitted from ESD protection device 60, but well region 64 of the same conductivity type as collection region 28 and ohmic contact region 32 is shown surrounding source contact region 26 and collection region 28, in accordance with an embodiment of the present invention.

As a result, a pnpn junction may be formed among source contact region 26, well region 64, semiconductor layer 62, and ohmic contact region 32. More specifically, in an embodiment, a first bipolar transistor (either npn or pnp) is formed by source contact region 26 (emitter or collector), well region 64 (base), and semiconductor layer 62 (collector or emitter). In addition, a second bipolar transistor (either pnp or npn) is formed by ohmic contact region 32 (emitter or collector), semiconductor layer 62 (base), and well region 64 (collector or emitter). Collectively, in an embodiment, the bipolar transistors serve as a silicon controlled rectifier (SCR) 66. In a particular embodiment, source contact region 26 and ohmic contact region 32 serve as cathodes and anodes of SCR 66, respectively or vice versa, depending on the conductivity types of the regions formed within ESD protection device 60. The dotted line region shown in FIG. 4 is used to illustrate the general connection of diffusion regions making up SCR 66 and is not intended to imply a particular boundary of the SCR.

As noted above, the ESD protection devices described herein may be incorporated to protect either pull-up or pull-down LDMOS output driver transistors. FIG. 5 illustrates a schematic of an exemplary circuit depicting an arrangement of one or more of the semiconductor structures depicted in FIGS. 1-4 in positions relative to output driver transistors, signal pads, and power supply pads of the circuit, in accordance with an embodiment of the present invention.

Referring to FIG. 5, a circuit 70 has ESD protection device 78 arranged in parallel with a component(s) to be protected, which in this example are manifested as LDMOS pull-down transistor 74. In such a configuration, a positive zap on high voltage signal pad 72 with respect to low power supply Vss will prompt ESD protection device 78 to trigger prior to LDMOS pull-down transistor 74 and thus divert excessive voltage on the bus common to both devices. Accordingly, in this example a node 79 on a path between high voltage signal pad 72 LDMOS pull-down transistor 74 can be thought of as a "node to be protected" in the discussion above and below. In addition, the inclusion of ESD protection circuit 80 along bus 81 between high voltage power supply VDD and low voltage power supply Vss may divert ESD current away from pull-down LDMOS transistor 76 (i.e., a component to be protected) when a negative zap on high voltage signal pad 72 with respect to high voltage power supply $V_{DD}$ occurs.

ESD protection devices 78 and 80 may include any of the configurations described in reference to FIGS. 1-4. In some embodiments, ESD protection devices 78 and 80 include the same configuration. In other embodiments, ESD protection devices 78 and 80 include different configurations. In yet other embodiments, one of ESD protection devices 78 and 80 is omitted from circuit 70. In such cases, alternative ESD protection devices may, in some embodiments, be incorporated onto the I/O signal pads of circuit 70. The continuation dots extending from pull-down output DEMOS transistors 74 and pull-up DEMOS transistors 76 indicate routings extending to circuitry internal to circuit 70.

In a second aspect of embodiments of the present invention, contact to an extended drain is removed or omitted in an ESD protection device. Such a configuration for an ESD protection device may mitigate trigger voltage walk-in that may compromise the device. For example, in accordance with an embodiment of the present invention, a trigger voltage walk-in causes the safe operating area of a product to change with time. In one embodiment, such a change can be catastrophic, particularly in the case of multiple ESD events. Thus, in one embodiment, the drain in an ESD device is disconnected to avoid trigger voltage walk-in. In one embodiment, the "disconnected" aspect is defined as not metallically connected to a node to be protected from ESD zaps. In another embodiment, the "disconnected" aspect is defined as insulation of the entire top surface of the drain region. In an embodiment, the entire top surface of an extended drain region is metallically insulated. In a particular embodiment, such a configuration for an ESD protection device allows for a faster triggering in response to an ESD event. In an embodiment, even though the drain is disconnected, $N_+$ region may still be used by incorporating the drain to control the actual breakdown voltage value of the ESD protection device. Thus, in accordance with an embodiment of the present invention, soft breakdown and trigger voltage walk-in can be mitigated or eliminated by removing the cladding layer of a silicided contact. In an embodiment, such a drain-disconnected configuration is used to make LDMOS output drivers ESD self-protecting. However, in a specific embodiment, such a device is applied as stand-alone ESD clamp. In an embodiment, by removing metallic contact to an extended drain region in an ESD protection device, the ESD robustness of the protection device is enhanced.

Figure 6:
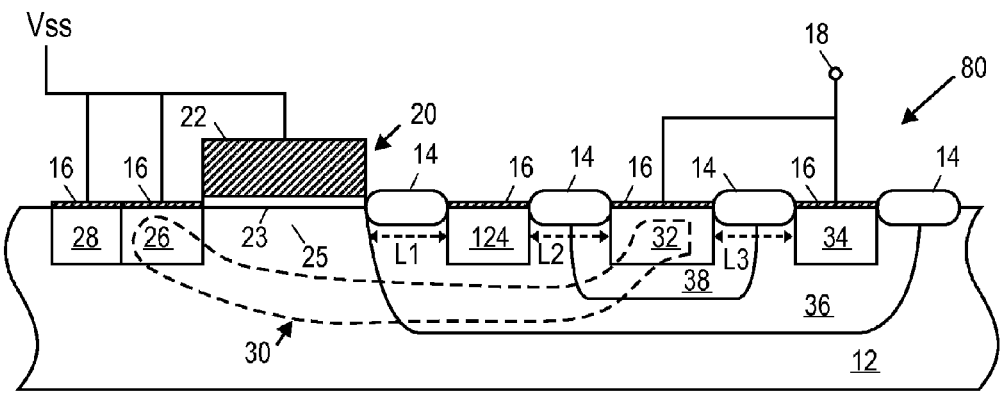
FIG. 6 illustrates a cross-sectional view of a semiconductor structure configured to provide protection from electrostatic discharge, including an extended drain region the entire top surface of which is insulated, in accordance with an embodiment of the present invention.

In an embodiment, a circuit with electrostatic discharge protection includes an output driver transistor with an extended drain contact region. FIG. 6 illustrates a cross-sectional view of a semiconductor structure configured to provide protection from electrostatic discharge, including an extended drain region the entire top surface of which is insulated, in accordance with an embodiment of the present invention. Referring to FIG. 6, a distinct device 80 is configured to provide electrostatic discharge protection for the output driver transistor (not shown). Distinct device 80 includes an electrostatic discharge protection transistor 20 with an extended drain region 124. In accordance with an embodiment of the present invention, the entire top surface of extended drain region 124 is insulated, e.g. disconnected from a node 18. Distinct device 80 also includes a silicon controlled rectifier (SCR) 30. SCR 30 includes a first terminal 32 spaced apart from extended drain region 124 of electrostatic discharge protection transistor 20. SCR 30 also includes a second terminal 26 configured to serve as a source contact region of electrostatic discharge protection transistor 20. SCR 30 further includes an ohmic contact region 34 spaced apart from first terminal 32 of SCR 30, and a collection region 28 arranged adjacent to second terminal 26 of SCR 30. Other labeled elements of FIG. 6 correspond to those elements described in association with FIG. 1. In accordance with an embodiment of the present invention, distinct device 80 is included in a circuit such as the circuit depicted in and described in association with FIG. 5.

In an embodiment, electrostatic discharge protection transistor 20 includes a gate electrode 22 disposed between extended drain region 124 and second terminal 26. Gate electrode 22 is spaced apart from extended drain region 124 by a field oxide isolation structure 14, as depicted in FIG. 6. In one embodiment, electrostatic discharge protection transistor 20 includes a gate electrode 22 disposed between extended drain region 124 and second terminal 26, and is spaced apart from extended drain region 124 by an isolation structure comprising a sidewall portion along a sidewall of gate electrode 22 and an extension portion between gate electrode 22 and extended drain region 124 (not shown in FIG. 6, but similar to that described in association with FIG. 2). In one embodiment, electrostatic discharge protection transistor 20 includes a gate electrode 22 disposed between extended drain region 124 and second terminal 26, and gate electrode 22 includes a pair of isolation sidewall spacers, one isolation sidewall spacer between gate electrode 22 and second terminal 26, and the other isolation sidewall spacer between gate electrode 22 and extended drain region 124 (not shown in FIG. 6, but similar to that described in association with FIG. 3). In an embodiment, the output driver transistor is a pull-up transistor. In another embodiment, the output driver transistor is a pull-down transistor. In an embodiment, electrostatic discharge protection transistor 20 is configured to breakdown at a lower voltage than the output driver transistor.

Figure 7:
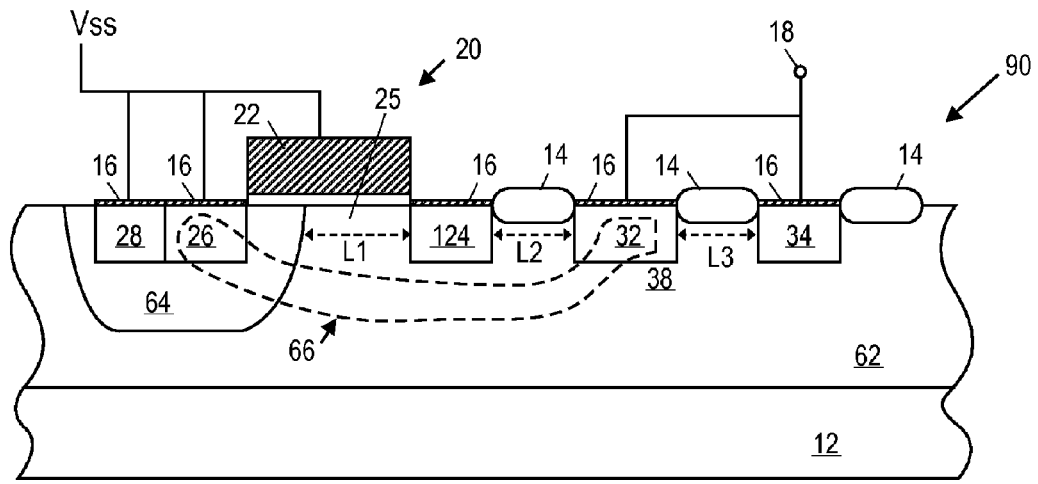
FIG. 7 illustrates a cross-sectional view of a semiconductor structure configured to provide protection from electrostatic discharge, including an extended drain region the entire top surface of which is insulated, in accordance with an embodiment of the present invention.

In an alternative embodiment, both a second terminal and a collection region are disposed in an isolated P-well region. FIG. 7 illustrates a cross-sectional view of a semiconductor structure configured to provide protection from electrostatic discharge, including an extended drain region the entire top surface of which is insulated, in accordance with an embodiment of the present invention. Referring to FIG. 7, distinct device 90 of an ESD protection device includes both second terminal 26 and collection region 28 disposed in an isolated P-well region 64. Other labeled elements of FIG. 7 correspond to those elements described in association with FIG. 4. In accordance with an embodiment of the present invention, distinct device 90 is included in a circuit such as the circuit depicted in and described in association with FIG. 5.

Figure 8:
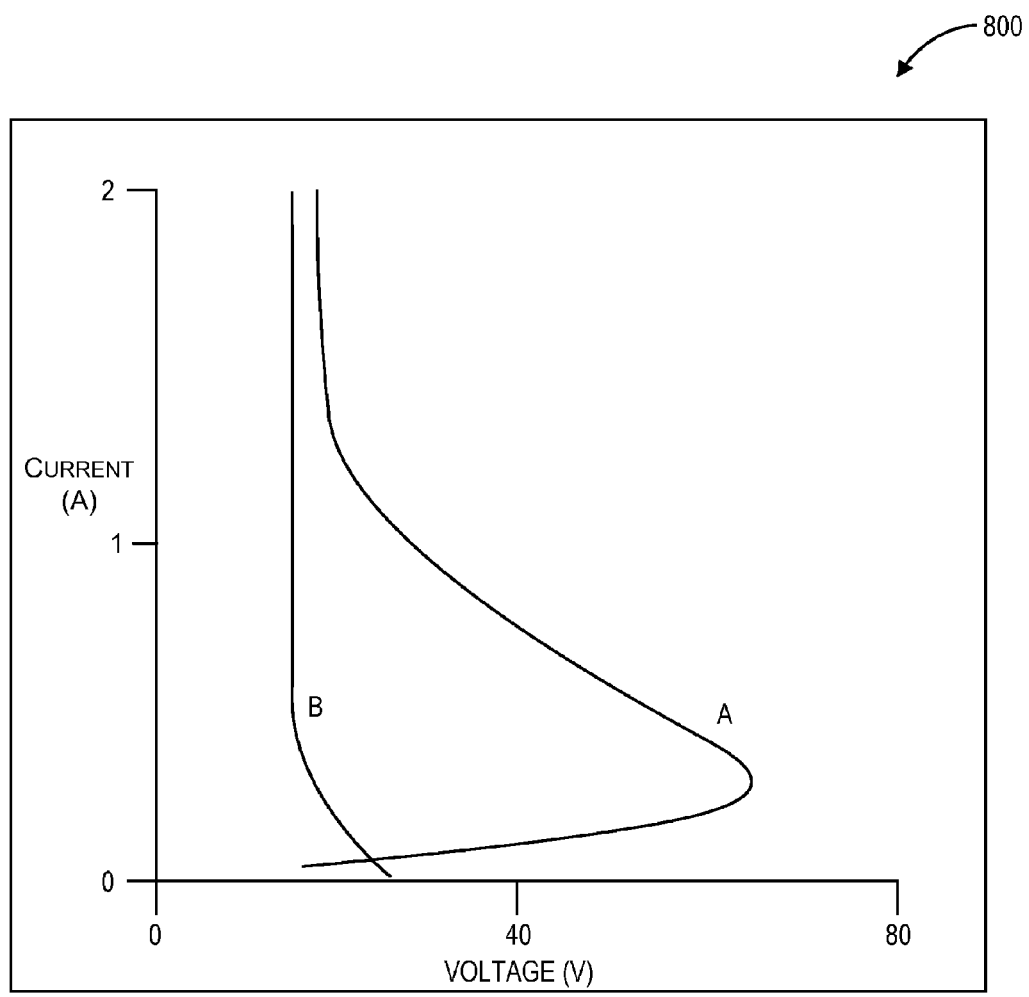
FIG. 8 illustrates a plot of current as a function of voltage for semiconductor structures configured to provide protection from electrostatic discharge, in accordance with an embodiment of the present invention.

An ESD protection device having a disconnected or insulated extended drain region may be more appropriate to handle multiple ESD events. FIG. 8 illustrates a plot 800 of current as a function of voltage for semiconductor structures configured to provide protection from electrostatic discharge, in accordance with an embodiment of the present invention. Referring to FIG. 8, curve A represents a response to a first ESD event for both a connected (such as the device shown in FIG. 1) and a disconnected (such as the device shown in FIG. 6) extended drain region. In an embodiment, in the case of the disconnected extended drain region, curve A also represents the response to subsequent ESD events. However, in an embodiment, in the case of the connected extended drain region, curve B represents the response to subsequent ESD events, which may be a failure mode for the protection device. Thus, in accordance with an embodiment of the present invention, a disconnected extended drain region is used to prevent trigger voltage walk-in during subsequent ESD events.

Figure 9:
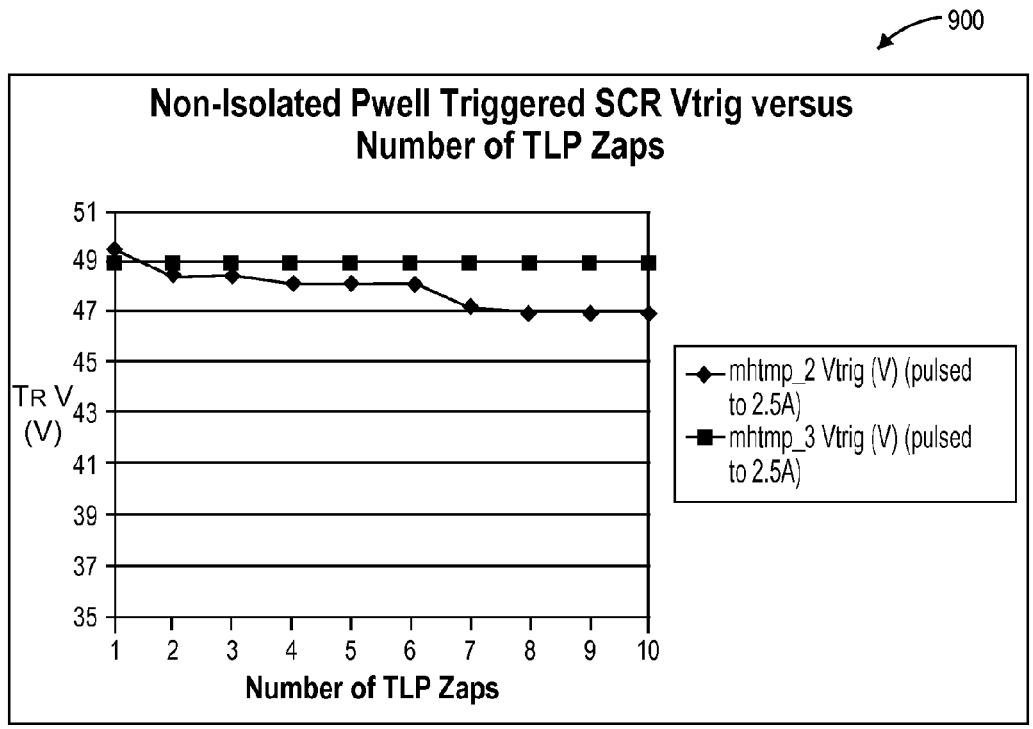
FIG. 9 illustrates a plot of trigger voltage as a function of Transmission Line Pulse (TLP) zaps for semiconductor structures configured to provide protection from electrostatic discharge, in accordance with an embodiment of the present invention.

FIG. 9 illustrates a plot 900 of trigger voltage as a function of Transmission Line Pulse (TLP) zaps for semiconductor structures configured to provide protection from electrostatic discharge, in accordance with an embodiment of the present invention. Referring to plot 900, for a non-isolated P-well structure, the effect of metallically disconnecting the N+ region closest to the trigger gate stops the walk-in of the trigger voltage and leads to a much more robust isolated P-well structure. MHTMP-3 is the same structure as MHTMP-2 but with the N+ region metallically disconnected. The current limit for both devices was 2.5 Amps. Leakage at 36 Volts increased from approximately 0.25 nanoAmps to approximately 15 nanoAmps for MHTMP-2 but stayed at approximately 0.25 nanoAmps for MHTMP-3.

Figure 10:
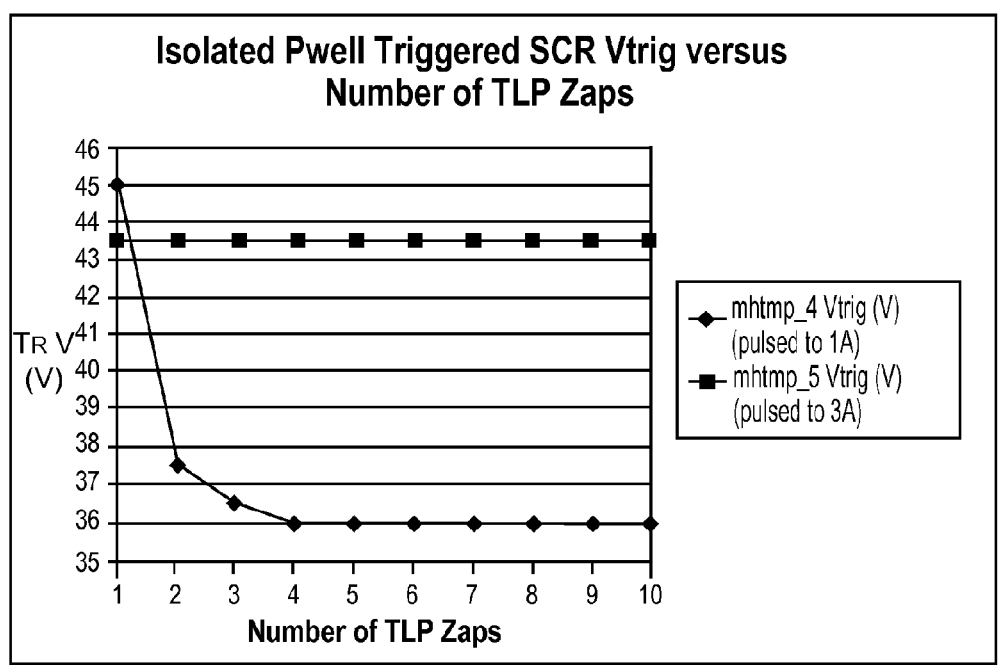
FIG. 10 illustrates a plot of trigger voltage as a function of TLP zaps for semiconductor structures configured to provide protection from electrostatic discharge, in accordance with an embodiment of the present invention.

FIG. 10 illustrates a plot 1000 of trigger voltage as a function of TLP zaps for semiconductor structures configured to provide protection from electrostatic discharge, in accordance with an embodiment of the present invention. Referring to plot 1000, for an isolated P-well structure, the effect of metallically disconnecting the N+ region closest to the trigger gate stops the walk-in of the trigger voltage and leads to a much more robust isolated P-well structure. MHTMP-5 is the same structure as MHTMP-4 but with the N+ region metallically disconnected. The current limit for the devices was 1 A for MHTMP-4 and 3 A for MHTMP-5. Leakage at 36 Volts increased from approximately 0.3 nanoAmps to approximately 200 nanoAmps for MHTMP-4 but stayed at approximately 0.3 nanoAmps for MHTMP-5.

In a third aspect of embodiments of the present invention, a gate plate is used as an adjustment of trigger voltage in an ESD protection transistor. There may be a strong influence of gate overlap on such a trigger voltage. Accordingly, in one embodiment, trigger voltage tunability is provided in a circuit layout by including a gate plate. In an embodiment, such a configuration saves changes at key layers (e.g. doping regions are kept the same and the trigger voltage is adjusted through gate dimensions and overlap with a corresponding isolation region. In one embodiment, gate plate overlap onto drain field oxide is to adjust as well as target the ESD trigger voltage. The extent of overlap between a gate electrode and the field oxide region is termed the "field plate" for embodiments herein. In an embodiment, a field plate approach is an alternative to changing size of an isolation region, but both modifications could be optimized together.

Figure 11:
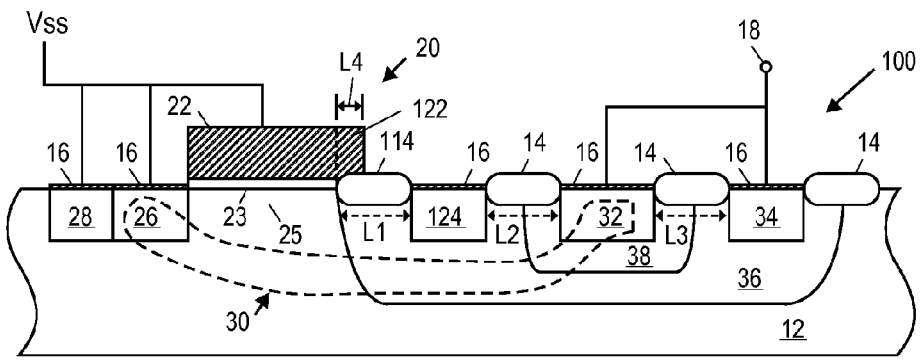
FIG. 11 illustrates a cross-sectional view of a semiconductor structure configured to provide protection from electrostatic discharge, including a portion of a length of a gate electrode that overlaps at least a portion of a field oxide isolation structure, in accordance with an embodiment of the present invention.

In an embodiment, a circuit with electrostatic discharge protection includes an output driver transistor with an extended drain contact region. FIG. 11 illustrates a cross-sectional view of a semiconductor structure configured to provide protection from electrostatic discharge, including a portion of a length of a gate electrode that overlaps at least a portion of a field oxide isolation structure, in accordance with an embodiment of the present invention. Referring to FIG. 11, a distinct device 100 is configured to provide electrostatic discharge protection for the output driver transistor (not shown). Distinct device 100 includes an electrostatic discharge protection transistor 20 with an extended drain region 124 and a gate electrode 22 spaced apart from extended drain region 124 by a field oxide isolation structure 114. In an embodiment, a portion 122 of gate electrode 22 overlaps at least a portion of field oxide isolation structure 114, as indicated by L4 in FIG. 11. Distinct device 100 also includes a silicon controlled rectifier (SCR 30). SCR 30 also includes a first terminal 32 spaced apart from extended drain region 124 of electrostatic discharge protection transistor 20. SCR 30 further includes a second terminal 26 configured to serve as a source contact region of electrostatic discharge protection transistor 20, and an ohmic contact region 34 spaced apart from first terminal 32 of SCR 30. A collection region 28 is arranged adjacent to second terminal 26 of SCR 30. Other labeled elements of FIG. 11 correspond to those elements described in association with FIG. 1. In accordance with an embodiment of the present invention, distinct device 100 is included in a circuit such as the circuit depicted in and described in association with FIG. 5.

In accordance with an embodiment of the present invention, the entire top surface of extended drain region 124 is disconnected from node 18 (e.g. the entire top surface is insulated), as depicted in FIG. 11. In an embodiment, both second terminal 26 and collection region 28 are disposed in an isolated P-well region (not shown, but similar to that described in association with FIG. 4). In one embodiment, the output driver transistor is a pull-up transistor. In another embodiment, the output driver transistor is a pull-down transistor.

Figure 12:
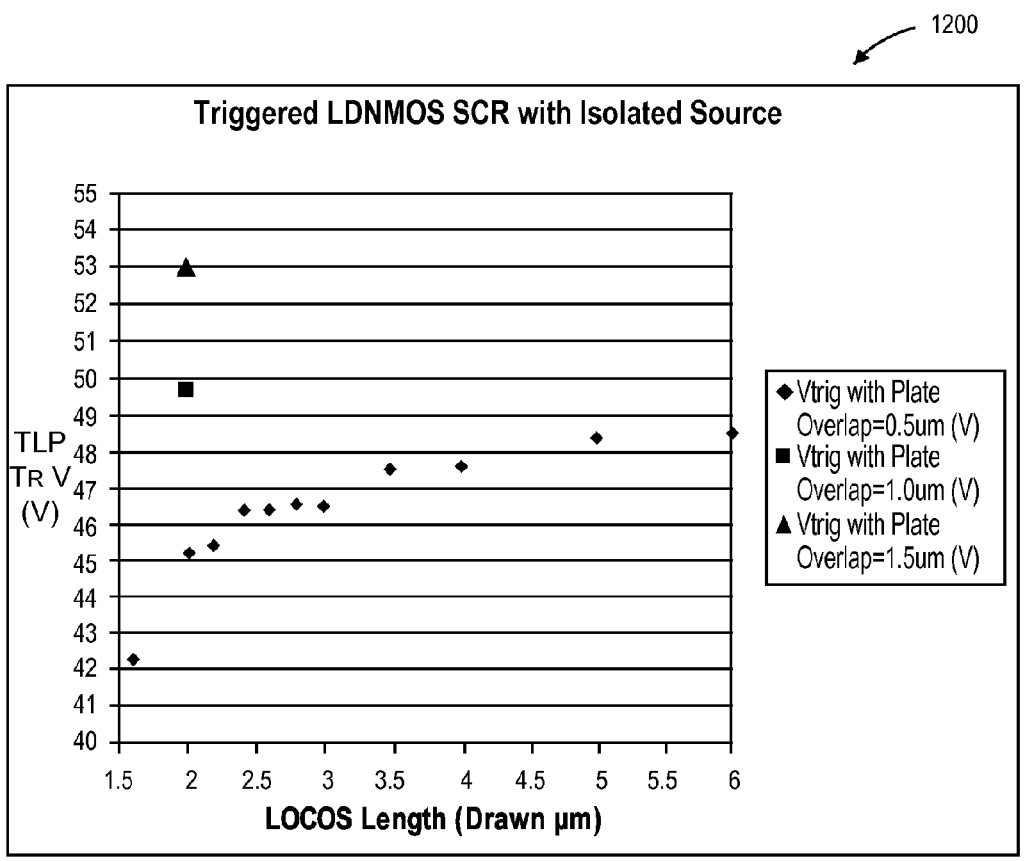
FIG. 12 illustrates a plot of TLP trigger voltage as a function of local isolation (LOCOS) length, in accordance with an embodiment of the present invention.

Gate plate overlap can be used to tune the trigger voltage of an ESD protection device. For example, FIG. 12 illustrates a plot 1200 of TLP trigger voltage as a function of local isolation (LOCOS) length, in accordance with an embodiment of the present invention. Referring to FIG. 12, gate plate overlap dimensions are provided for a 0.5 micron, a 1 micron, and a 1.5 micron overlap. The TLP trigger voltage increases with increasing overlap. Additionally, in accordance with an embodiment of the present invention, the length of an isolation structure (LOCOS) used to space an extended drain region from the portion of the gate that influences a corresponding channel region is varied. As shown in plot 1200, the TLP trigger voltage increases with increasing length of the isolation structure.

Figure 13:
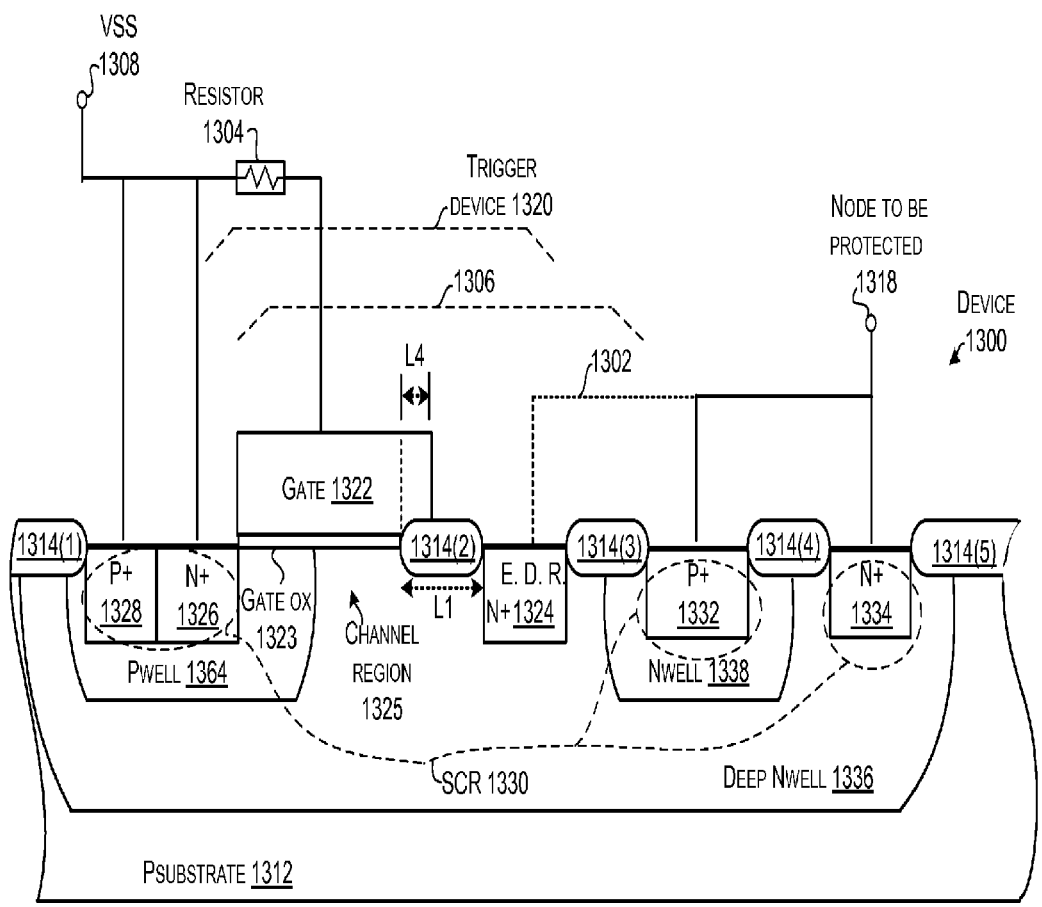
FIGS. 13-19 illustrate cross-sectional views of a semiconductor structure that includes devices configured to provide ESD protection, in accordance with an embodiment of the present invention.

FIG. 13 shows another device 1300 that is similar to the devices 10, 40, 50, 60, 70, 80, 90 and 100 introduced above. Many of the labeled elements of FIG. 13 correspond to those elements described in association with FIG. 1. Accordingly, the numerical designators are carried forward as much as possible to avoid redundancy. For clarification sake, the prefix "13" has been added to the numerical designators relative to FIG. 13. In some instances, device 1300 can be included in a circuit, such as the circuit depicted in, and described in association with, FIG. 5.

In the illustrated configuration of FIG. 13, device 1300 includes trigger device 1320 that can be manifested as a DEMOS transistor, among others. For discussion purposes, trigger device 1320 can be thought of as including second terminal 1326 (that can function as a source contact region), gate 1322, gate oxide 1323, insulating structure 1314, and extended drain region 1324. Device 1300 also includes SCR 1330. For discussion purposes, the SCR can be thought of as including second terminal 1326 and first terminal 1332 that can function as an ohmic contact region. Viewed another way, SCR 1330 can be considered to include second terminal 1326, collection region 1328, first terminal 1332, and ohmic contact region 1334.

Collection region 1328 and second terminal 1326 are formed in well region 1364, which in this implementation is a positively charged region and can be referred to as a P-well. In this example, the well region 1364 extends from insulating structure 1314(1) to gate oxide 1323. Similarly, first terminal 1332 is formed in well region 1338 that extends from insulating structure 1314(3) to insulating structure 1314(4). In this case, well region 1338 is a negatively charged region and can be referred to as an N-well. A deep well region 1336 is formed in substrate 1312 below the above mentioned components and extends between isolation structure 1314(1) and isolation structure 1314(5). In this example deep well region 1336 is negatively charged and can be referred to as a Deep N-well. In this example, substrate 1312 is a P-substrate which dictates the configuration of the components formed therein and thereupon. Other configurations can utilize an N-substrate or un-doped substrate with correspondingly selected overlying components.

In this case, node to be protected 1318 is coupled to first terminal 1332, ohmic contact region 1334, and optionally to extended drain region 1324 as indicated by dotted line 1302. Ground or Vss 1308 is also connected to collection region 1328 and second terminal 1326. Device 1300 also includes a resistor 1304 coupled between Vss 1308 and gate or gate electrode 1322. In this example, resistor 1304 is coupled on the gate side of these connections to collection region 1328 and second terminal 1326.

The illustrated configuration of FIG. 13 offers ESD protection between node to be protected 1318 and ground or Vss 1308. This ESD protection is then afforded to components to be protected that are also connected to node to be protected 1318. Examples of such components are illustrated and discussed above relative to FIG. 5.

As discussed in detail above relative to FIG. 11, properties associated with isolation structure 1314(2) can be selected to determine the characteristics of device 1300, such as the trigger voltage and/or breakdown voltage. Further, in this implementation the resistance of resistor 1304 can be considered with the capacitance of gate 1322, and/or distances L1 and L4, among others, to control the trigger voltage.

One point of interest is maintaining the trigger voltage over multiple ESD events. As discussed above, the trigger voltage of previous technologies tends to be affected by an ESD event. For instance, a hypothetical device that has a trigger voltage of 50 volts prior to a first ESD event may have a trigger voltage of 40 volts for a second ESD event and 30 volts for a third ESD event. In such cases, the functionality of the device employing the ESD protection can be compromised.

In contrast, some of the present implementations can maintain a generally uniform trigger voltage over multiple ESD events. In many instances the change in trigger voltage observed in previous technologies is due to metal migration or protrusion that occurs during an ESD event. This metal migration is sometimes referred to as trigger voltage walk-in or the walk-in phenomena.

Recall that distances L1 and L4 can affect the trigger voltage. In some instances, an initial ESD event can cause metal migration from extended drain region 1324 toward and/or under isolation structure 1314(2). This metal migration can change (i.e., shorten) the effective distance of L1 and thereby change the trigger voltage for subsequent ESD events. Accordingly, some of the present implementations can reduce and/or eliminate metal migration from extended drain region 1324 during ESD events. Reducing or eliminating metal migration can maintain a generally uniform trigger voltage over successive ESD events.

Some implementations can reduce metal migration by electrically insulating extended drain region 1324 from node to be protected 1318. This configuration decreases or eliminates current flow through the extended drain region to a level sufficient that metal migration is reduced or eliminated. Other implementations can reduce metal migration while allowing extended drain region 1324 to be connected to the node to be protected 1318, such as via connection 1302. Some of these implementations can reduce metal migration by removing metal from the extended drain region 1324 prior to the ESD events, such as at the time of manufacture. FIGS. 14-18 offer several such examples relating to a subset 1306 of device 1300.

Figure 14:
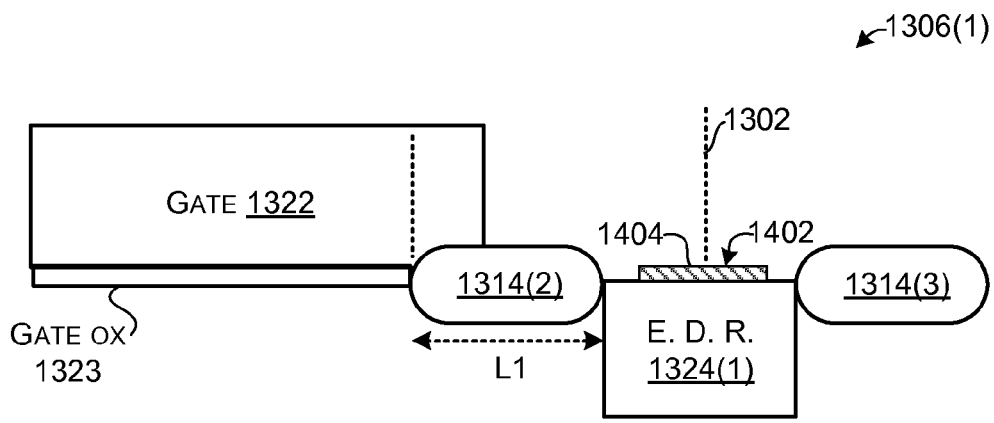

FIGS. 14-17 collectively illustrate how some of the present implementations can address metal migration related to an ESD event. FIG. 14 offers a more detailed view of a subset 1306(1) that is a variation of subset 1306 of FIG. 13. Subset 1306(1) includes gate 1322, gate oxide 1323, isolation structure 1314(2), extended drain region 1324(1), isolation structure 1314(3) and connection 1302. A contact region 1402 that contains metal 1404 is also included in FIG. 14 relative to extended drain region 1324(1). While a contact region is shown here, the same principles can be applied to other metal on the extended drain region, such as metal poles and vias, among others.

Figure 15:
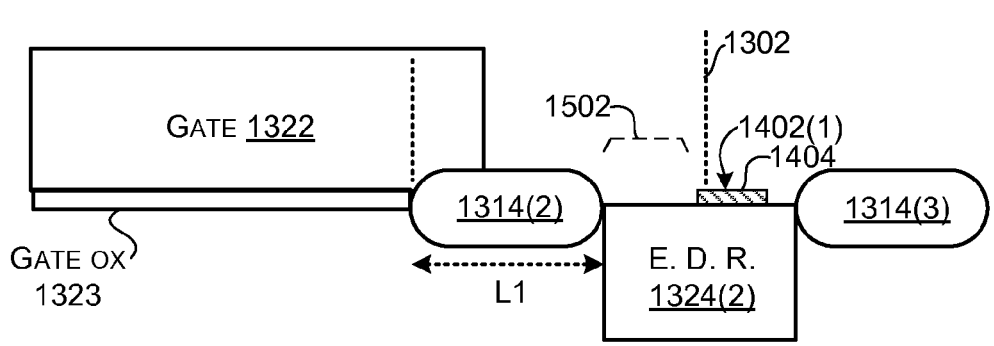

FIG. 15 shows another subset 1306(2) where a portion 1502 of extended drain region 1324(2) is substantially metal-free. In this case, contact 1402(1) does not occur in portion 1502. The portion 1502 can be located proximate isolation structure 1314(2) and away from isolation structure 1314(3). Portion 1502 can be manufactured to be substantially metal-free. Alternatively or additionally, metal can be removed from portion 1502 as part of the manufacturing process. Extended drain region 1324(2) is substantially metal-free in that any metal remaining in the extended drain region and/or the substantially metal-free portion of the extended drain region tends not to migrate during an ESD event to an extent that it changes the trigger and/or breakdown properties of device 100 for subsequent ESD events.

To summarize, the metal-free portion 1502 is proximate isolation structure 1314 and gate 1322 where metal migration can be more likely to occur. The configuration illustrated in FIG. 15 can address two potentially opposing considerations. In some scenarios it can be desirable to allow metal to be utilized on extended drain region 1324(2) and further allow current flow from the node to be protected (FIG. 13) to flow through the extended drain region. Yet, metal migration related to the extended drain region can be problematic. This configuration can reduce and/or eliminate metal that is more likely to migrate during an ESD event and allow metal that is less likely to migrate.

Figure 16:
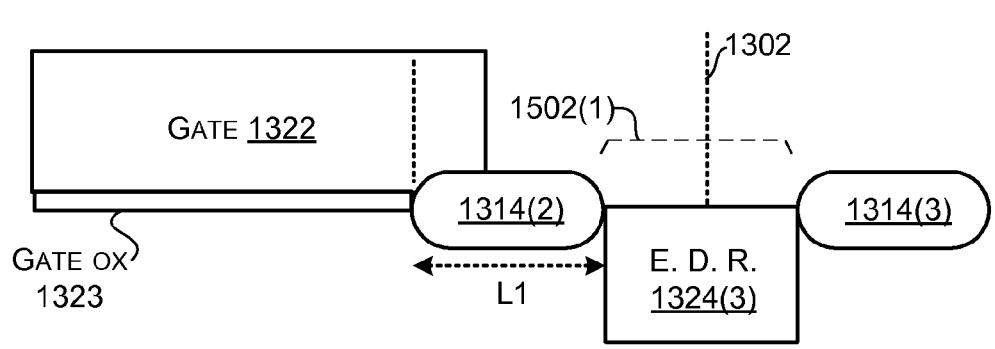

FIG. 16 shows an alternative configuration of subset 1306 (3) where metal-free portion 1502(1) includes the entirety of the extended drain region 1324(3). Stated another way, extended drain region 1324(3) is substantially metal-free in subset 1306(3).

Figure 17:
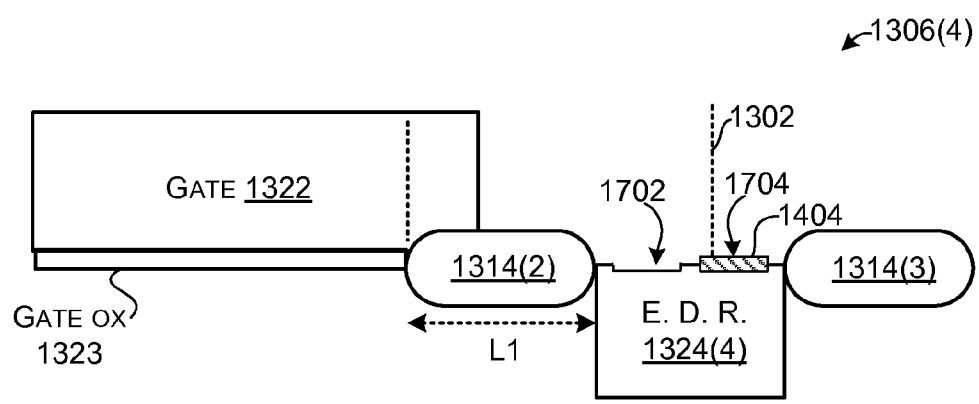

FIG. 17 shows another configuration of subset 1306(4) where metal is removed from a contact 1702 that is proximate isolation structure 1314(2) while metal 1404 remains in a second contact 1704 that is more distant from isolation structure 1314(2). In this case, the removed metal extended into the extended drain region 1324(4) in a via rather than solely being positioned upon the extended drain region.

In summary, some of the present implementations can offer consistently performing ESD protection to a node to be protected. One technique that contributes to consistent ESD protection is to limit or prevent metal migration during an ESD event. Metal migration can be limited by removing metal from the extended drain region; either entirely or proximate the gate.

Returning to FIG. 13, details are now provided for manufacturing device 1300. These details can augment, be used in conjunction with, or in place of, the details provided above relative to FIGS. 1-11.

Working upward from the silicon substrate 1312, the first two features are the deep N-well 1336 and N-well 1338. In this implementation, the deep N-well is a negatively doped layer. The dopant can be Phosphorus, among others. Energy levels can range from about 600 Kilo electron volts to about 2.0 mega electron volts. Concentrations can be $1.0 \times 10^{11}$ atoms cm-3 to $1.0 \times 10^{13}$ atoms cm-3. The N-well 1338 is a doping layer utilizing Arsenic or Phosphorus, among others, as the dopant. Dopant levels can range from about $1.0 \times 10^{11}$ atoms cm-3 to $1.0 \times 10^{14}$ atoms cm-3.

Briefly, in some implementations, source and drain regions can be formed utilizing a single implant or a series of implants utilizing suitable materials, such as arsenic. Implant energy can range from about 10 kilovolts to about 60 kilovolts. Peak concentrations can range from about $1 \times 10^{13}$ atoms cm-3 to $3 \times 10^{15}$ of arsenic dopant. Positive regions can be doped with Boron or Boron-di-Fluoride ($BF_2$) in a range of about 250 electron volts to about 30,000 electron volts. Where $BF_2$ is utilized it can range from about 2,000 electron volts to 90,000 electron volts. Arsenic can be utilized at $1 \times 10^{13}$ atoms cm-3 to $3 \times 10^{15}$ atoms cm-3, peak concentration of $5 \times 10^{20}$ atoms cm-3.

In some implementations, isolation regions 1314(1), 1314 (2), 1314(3), 1314(4) and 1314(5) can be Silicon Dioxide formed by local oxidation of Silicon (LCOS) or a high density plasma deposition isolation process. Gate oxide 1323 can be Silicon Oxide, Silicon Dioxide, or Silicon Nitride, among others. Gate 1322 is the polysilicon gate electrode layer with doping metals of about 1-20%, typically Phosphorus or Arsenic. In one instance, N-well 1338 and P-well 1364 have a depth of about 1 micron, deep N-well 1336 has a depth of about 1.5 to 6 microns. In some implementations, the depth of isolation regions 1314(1)-1314(5) can be 3,000 to 5,000 angstroms. Similarly, the depth of second terminal 1326, contact region 1328, first terminal 1332, contact region 1334, and extended drain region 1324 can be about 2 microns.

In some cases, second terminal 1326, extended drain region 1324, and ohmic contact region 1334 can be manufactured together. Similarly, collection region 1328 and first contact 1332 can be manufactured together.

As mentioned above, the width L1 of extended drain region 1324 can at least partially control the voltage rating of trigger device 1320. For example, for a 40 v circuit to be protected that has a trigger voltage of 60 v, the width of extended drain region 1324 can be about 2.5 microns.

In the implementation of FIG. 13, the SCR 1330 is fully embedded in the deep N-well 1336. Thus, the SCR's second terminal 1326, collection region 1328, first terminal 1332, and ohmic contact region 1334 are fully isolated from the substrate 1312. This configuration can decrease leakage prior to triggering when compared to prior configurations. Further, in this implementation, N-well 1338 decreases leakage from first terminal 1332 toward extended drain region 1324. Accordingly, N-well 1338 can further contribute to breakdown characteristics of device 1300.

For purposes of explanation consider an example where the node to be protected 1318 is connected to an input/output pad (not shown). Device 1300 can be considered as part of a semiconductor device and the input/output (I/O) pad can be external to the semiconductor device and connected to node to be protected 1318. An ESD event can be introduced, such as by a user touching the I/O pad. The ESD event can pass through the node to be protected 1318 and into ohmic contact region 1334 that is situated in deep N-well 1336. As mention above, N-well 1338 can be a higher doped region compared to deep N-well 1336. This configuration forms a diffusion region between ohmic contact region 1334 and extended drain region 1324.

At some point during the ESD event, the voltage may increase above Vcc. When the voltage exceeds Vcc, the trigger device 1320 functions to clamp the node to be protected 1318 to Vss 1308 via SCR 1330. Viewed another way, the ESD event causes massive current flow between the node to be protected 1318 and the low node or Vss 1308 by basically shorting the I/O to ground or power supply to ground through the SCR 1330. ESD events are generally short, such as less than 100 nanoseconds for example. After about 100 nanoseconds the energy tends to be dissipated and the ESD event cannot sustain itself and the SCR opens up. As noted above, the present implementations can perform similarly from one ESD event to the next. Further, N-well 1338 can reduce leakage and/or breakdown problems associated with first terminal 1332. Further still, deep N-well 1336 can encompass all of SCR 1330 thereby further reducing leakage.

Figure 18:
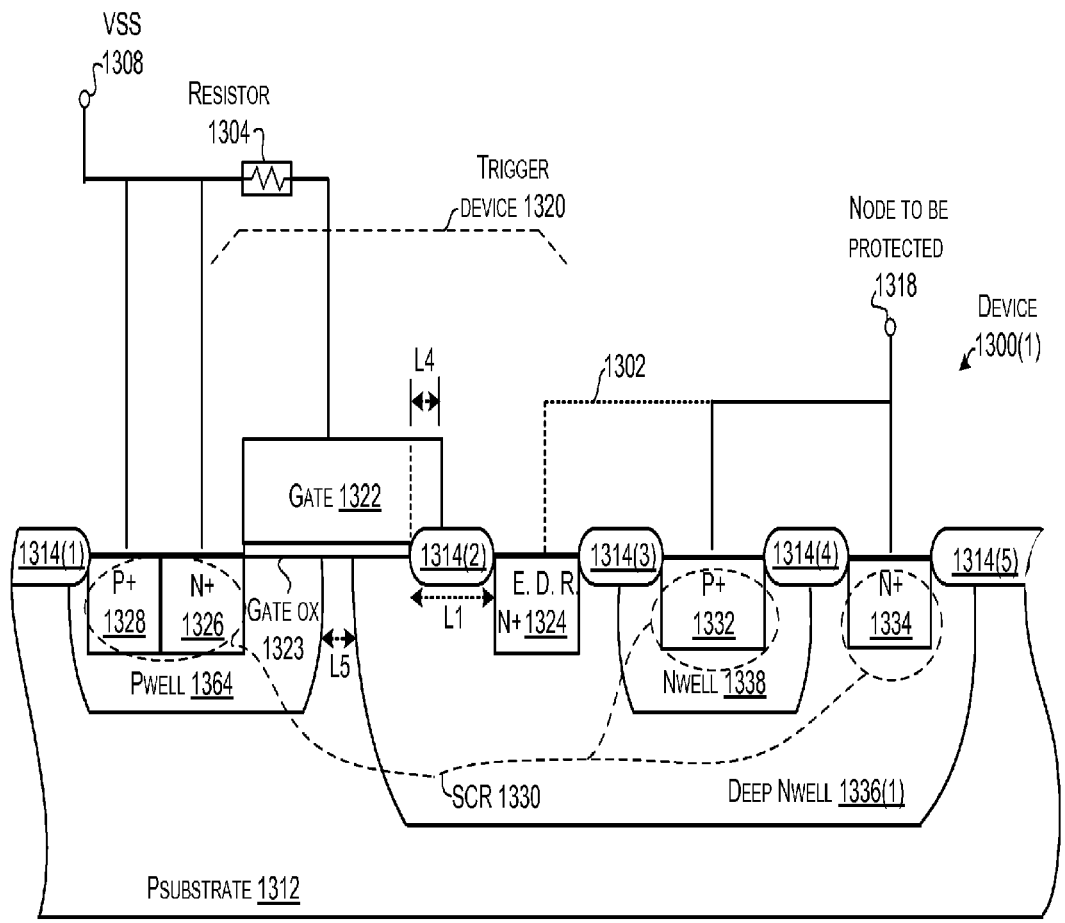

FIG. 18 shows an alternative configuration of a device 1300(1) where deep N-well 1336(1) does not encompass the entire SCR 1330. Instead, the deep N-well 1336(1) stops at the gate oxide 1323. Thus, the deep N-well and the P-well 1364 are separated by a horizontal distance L5. In one example, distance L5 can have a value of about 0.5 um. Distance L5 can be adjusted to vary the properties of the device for a particular device configuration.

Figure 19:
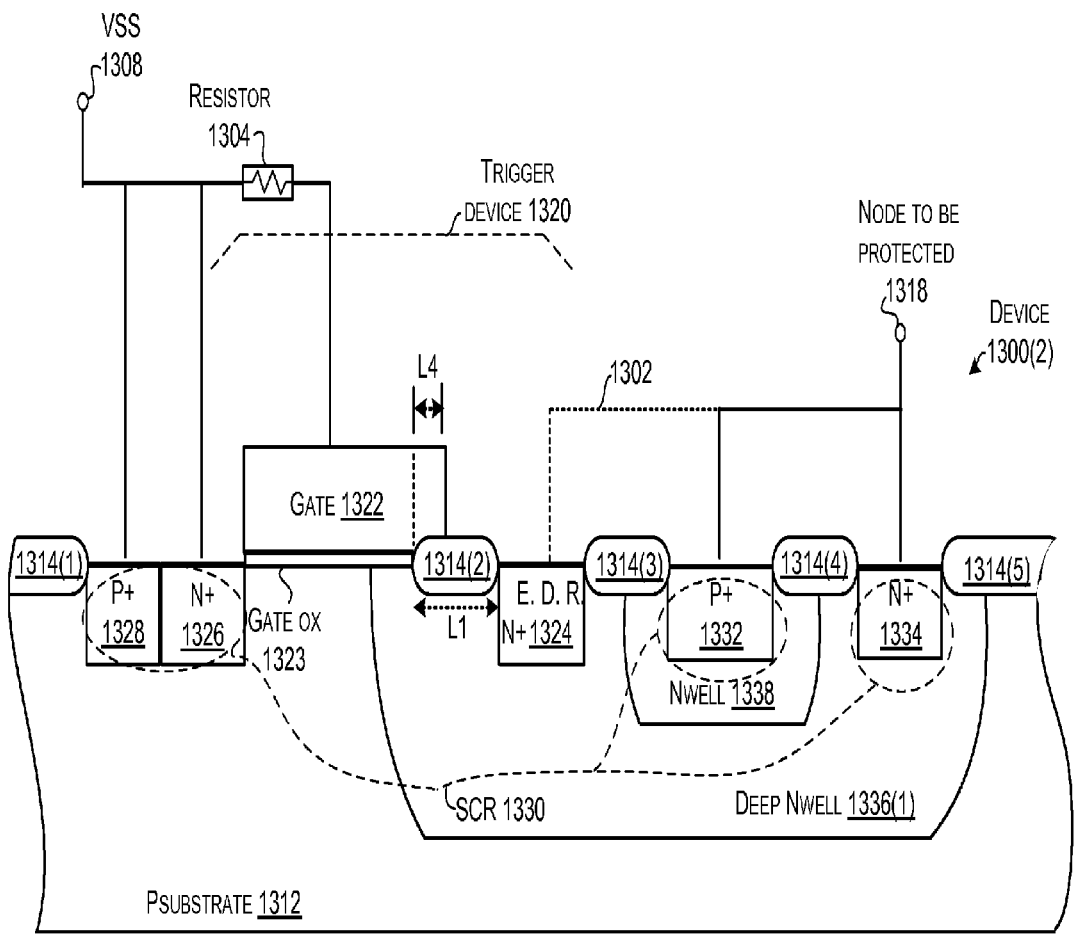

FIG. 19 shows still another alternative configuration of a device 1300(2). This implementation does not employ a P-well. Further, deep N-well 1336(1) does not encompass the entire SCR 1330. In this case, deep N-well 1336(1) stops at the gate oxide 1323.

In summary, the above implementations can offer consistent ESD protection across multiple ESD events, by among other factors reducing and/or eliminating metal migration during ESD events.

Example Methods

In accordance with embodiments of the present invention, a method for providing a trigger voltage for a circuit with electrostatic discharge protection is provided. The method includes forming an output driver transistor with an extended drain contact region. The method also includes forming a distinct device configured to provide electrostatic discharge protection for the output driver transistor. Forming the distinct device includes forming an electrostatic discharge protection transistor with an extended drain region and a gate electrode spaced apart from the extended drain region by a field oxide isolation structure, a portion of the length of the gate electrode overlapping at least a portion of the field oxide isolation structure. In one embodiment, the length of the portion of the gate electrode is selected to determine the trigger voltage. Forming the distinct device also includes forming a silicon controlled rectifier including forming a first terminal spaced apart from the extended drain region of the electrostatic discharge protection transistor and forming a second terminal configured to serve as a source contact region of the electrostatic discharge protection transistor. Forming the distinct device also includes forming an ohmic contact region spaced apart from the first terminal of the silicon controlled rectifier and forming a collection region arranged adjacent to the second terminal of the silicon controlled rectifier.

In an embodiment, forming an electrostatic discharge protection transistor includes further selecting the distance between the gate electrode and the extended drain region, along with the length of the portion of the gate electrode, to determine the trigger voltage. In an embodiment, forming the electrostatic discharge protection transistor with the extended drain region includes insulating the entire top surface of the extended drain region. In an embodiment, forming both the second terminal and the collection region includes forming the second terminal and the collection region in an isolated P-well region. In an embodiment, forming the output driver transistor includes forming a pull-up transistor. In an embodiment, forming the output driver transistor includes forming a pull-down transistor. In an embodiment, forming the electrostatic discharge protection transistor includes configuring the electrostatic discharge protection transistor to breakdown at a lower voltage than the output driver transistor. In an embodiment, a target trigger voltage is above a maximum operating voltage, which is in between a Vcc (lowest) and an internal breakdown voltage (highest) of a protected circuit.

Figure 20:
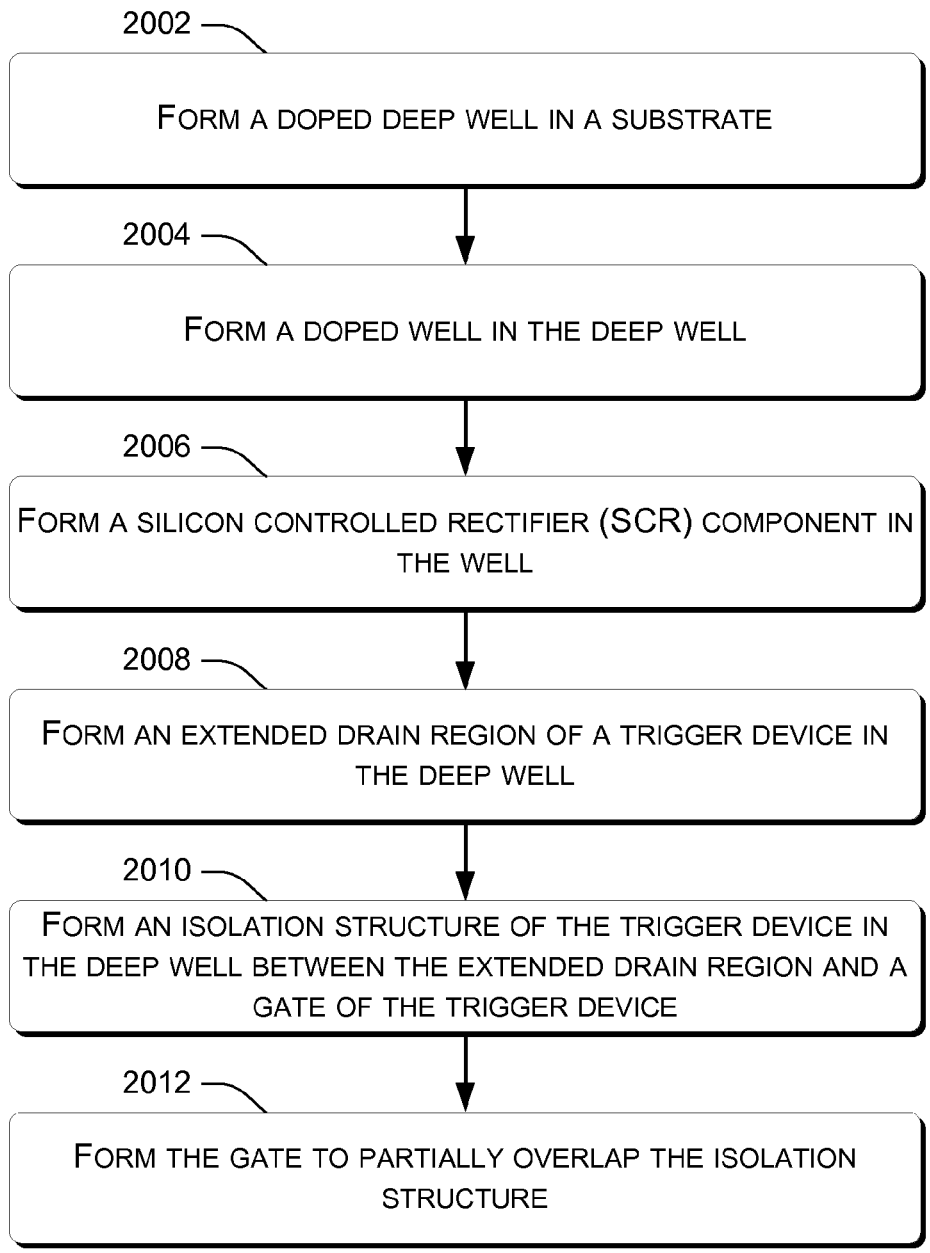
FIG. 20 shows a method of manufacture that can form a device that offers ESD protection.

FIG. 20 shows another process or method 2000 that can offer ESD protection on a given device.

At block 2002 the method forms a doped deep well in a substrate. The substrate can be doped or un-doped. In instances where the substrate is doped, the doping of the deep well can be the same charge (i.e., both positive or both negative) or of the opposite charge (one positive and the other negative).

At block 2004 the method forms a doped well in the deep well. In some implementations, the well is doped at higher concentrations than the deep well. Often the charge of the well can be of the same charge type as the deep well, but such need not be the case.

At block 2006 the method forms at least a portion of a silicon controlled rectifier (SCR) component in the well. In one case the component is a contact region that has an opposite charge as the well.

At block 2008 the method forms an extended drain region of a trigger device in the deep well. Often, the extended drain region has an opposite charge as the SCR component, but such need not be the case. In some implementations, the extended drain region can be substantially metal-free or otherwise configured to reduce and/or eliminate metal migration from the extended drain region during an ESD event.

At block 2010 the method forms an isolation structure of the trigger device in the deep well between the extended drain region and a gate of the trigger device.

At block 2012 the method forms the gate to partially overlap the isolation structure. The amount of overlap and/or the dimensions of the isolation structure can be adjusted to define a trigger voltage of the trigger device.

It will be appreciated by those skilled in the art having the benefit of this disclosure that embodiments of the present invention provide devices for protecting LDMOS output driver transistors from damage caused by ESD events. Further modifications and alternative embodiments of various aspects of embodiments of the invention will be apparent to those skilled in the art in view of this description. For example, although the devices are specifically discussed in reference to protection from ESD events, the devices may additionally or alternatively be used to protect against other excessive voltage events.

Thus, a circuit with electrostatic discharge protection has been disclosed. In accordance with an embodiment of the present invention, the circuit includes an output driver transistor with an extended drain contact region. The circuit also includes a distinct device configured to provide electrostatic discharge protection for the output driver transistor. The distinct device includes an electrostatic discharge protection transistor with an extended drain region. The entire top surface of the extended drain region is insulated. The distinct device also includes a silicon controlled rectifier including a first terminal spaced apart from the extended drain region of the electrostatic discharge protection transistor, and a second terminal configured to serve as a source contact region of the electrostatic discharge protection transistor. The distinct device also includes an ohmic contact region spaced apart from the first terminal of the silicon controlled rectifier, and a collection region arranged adjacent to the second terminal of the silicon controlled rectifier. In one embodiment, both the second terminal and the collection region are disposed in an isolated P-well region. In one embodiment, the electrostatic discharge protection transistor is configured to breakdown at a lower voltage than the output driver transistor.

What is claimed is:

1. A device comprising:
   a circuit including a source region and a drain region; and
   a silicon-controlled rectifier including a contact region coupled with the drain region of the circuit, wherein the silicon-controlled rectifier is configured to pass a transfer charge from the contact region to the source region of the circuit during an electrostatic discharge (ESD) event, wherein the circuit includes an isolation structure interposed between a gate oxide of the circuit and the drain region, and wherein a portion of the drain region proximate to the isolation structure is substantially metal-free.

2. The device of claim 1, wherein the silicon-controlled rectifier is configured to pass the transfer charge from the contact region to the source region of the circuit when the transfer charge has a voltage level above a trigger voltage.

3. The device of claim 2, wherein the silicon-controlled rectifier further comprises an isolation structure interposed between the contact region of the silicon-controlled rectifier and the drain region of the circuit, and wherein a magnitude of the trigger voltage corresponds a distance between the contact region of the silicon-controlled rectifier and the drain region of the circuit.

4. The device of claim 2, wherein the drain region of the circuit is an extended drain, and wherein a magnitude of the trigger voltage corresponds a distance between the gate oxide of the circuit and the extended drain.

5. The device of claim 1, wherein an entirety of the drain region proximate to the isolation structure is substantially metal-free.

6. The device of claim 1, wherein the portion of the drain region proximate to the isolation structure is substantially metal-free to a degree that metal protrusion does not occur from the portion toward the isolation structure during the ESD event.

7. The device of claim 2, wherein the source region of the circuit is disposed in a well, and wherein a magnitude of the trigger voltage corresponds a distance between the drain region and a location of the well associated with the source region of the circuit.

8. The device of claim 1, wherein the silicon-controlled rectifier includes a pair of bipolar transistors coupled between the contact region and the source region of the circuit.

* * * * *